(12) United States Patent
Takeda et al.

(10) Patent No.: US 12,412,610 B2
(45) Date of Patent: Sep. 9, 2025

(54) SEMICONDUCTOR DEVICE

(71) Applicant: RENESAS ELECTRONICS CORPORATION, Tokyo (JP)

(72) Inventors: Koichi Takeda, Tokyo (JP); Akihiko Kanda, Tokyo (JP); Takahiro Shimoi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 228 days.

(21) Appl. No.: 18/317,382

(22) Filed: May 15, 2023

(65) Prior Publication Data
US 2023/0402080 A1 Dec. 14, 2023

(30) Foreign Application Priority Data

Jun. 10, 2022 (JP) ................................. 2022-094430

(51) Int. Cl.
*G11C 11/16* (2006.01)
*G11C 7/08* (2006.01)

(52) U.S. Cl.
CPC ............ *G11C 11/1673* (2013.01); *G11C 7/08* (2013.01); *G11C 11/1675* (2013.01)

(58) Field of Classification Search
CPC .... G11C 11/1673; G11C 7/08; G11C 11/1675
See application file for complete search history.

(56) References Cited

U.S. PATENT DOCUMENTS 10,529,777 B2 * 1/2020 Sei ..................... G11C 13/0004

OTHER PUBLICATIONS

Yu-Der Chih et al., "13.3 A 22nm 32Mb Embedded STT-MRAM with 10ns Read Speed, 1M Cycle Write Endurance, 10 Years Retention at 150°C and High Immunity to Magnetic Field Interference", 2020 ISSCC , pp. 222-224.

* cited by examiner

*Primary Examiner* — Han Yang
(74) *Attorney, Agent, or Firm* — Rimon P.C.

(57) ABSTRACT

A clamp element 46 applies a fixed potential to a bit line BL at a time of a readout operation. A reference current source RCS generates a reference current Iref. An offset current source OCS1 is activated at a time of a readout operation for an OTP cell OTPC, and at a time of being activated, generates an offset current Iof1 to be subtracted from a cell current Icel. At the time of the readout operation for the OTP cell OTPC, the sense amplifier SA detects a magnitude relationship between the reference current Iref and a readout current Ird obtained by subtracting the offset current Iof1 from the cell current Icel.

8 Claims, 14 Drawing Sheets

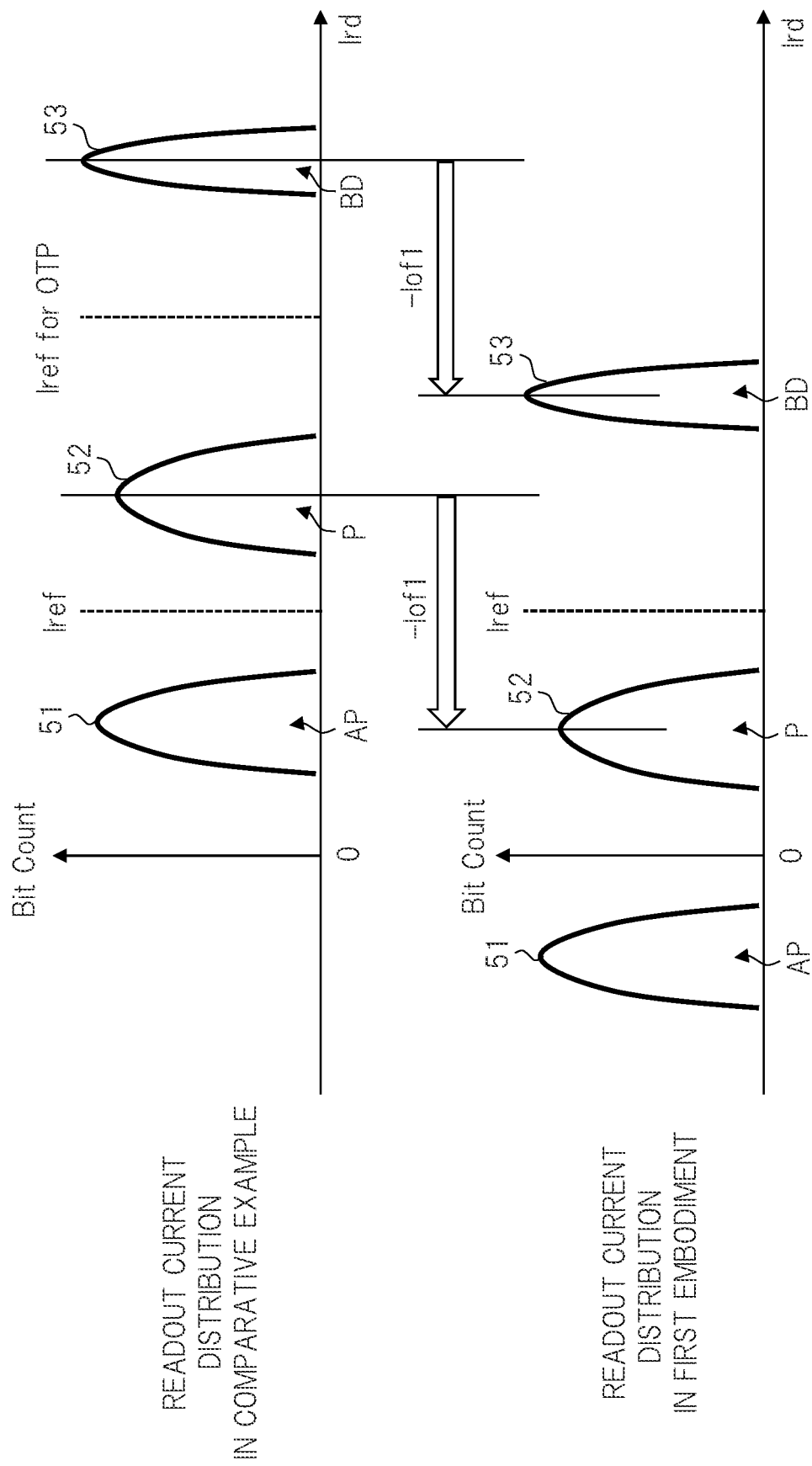

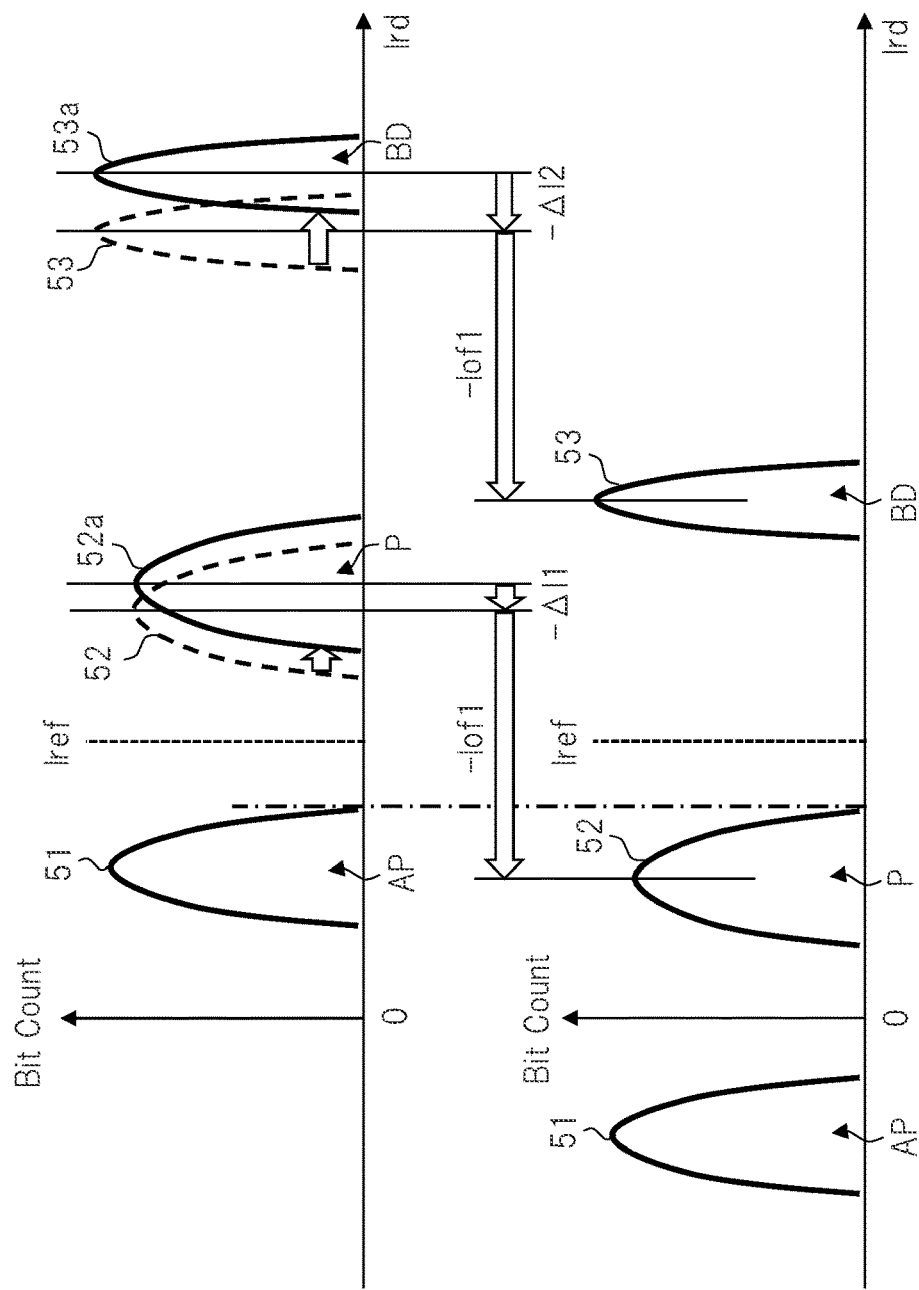

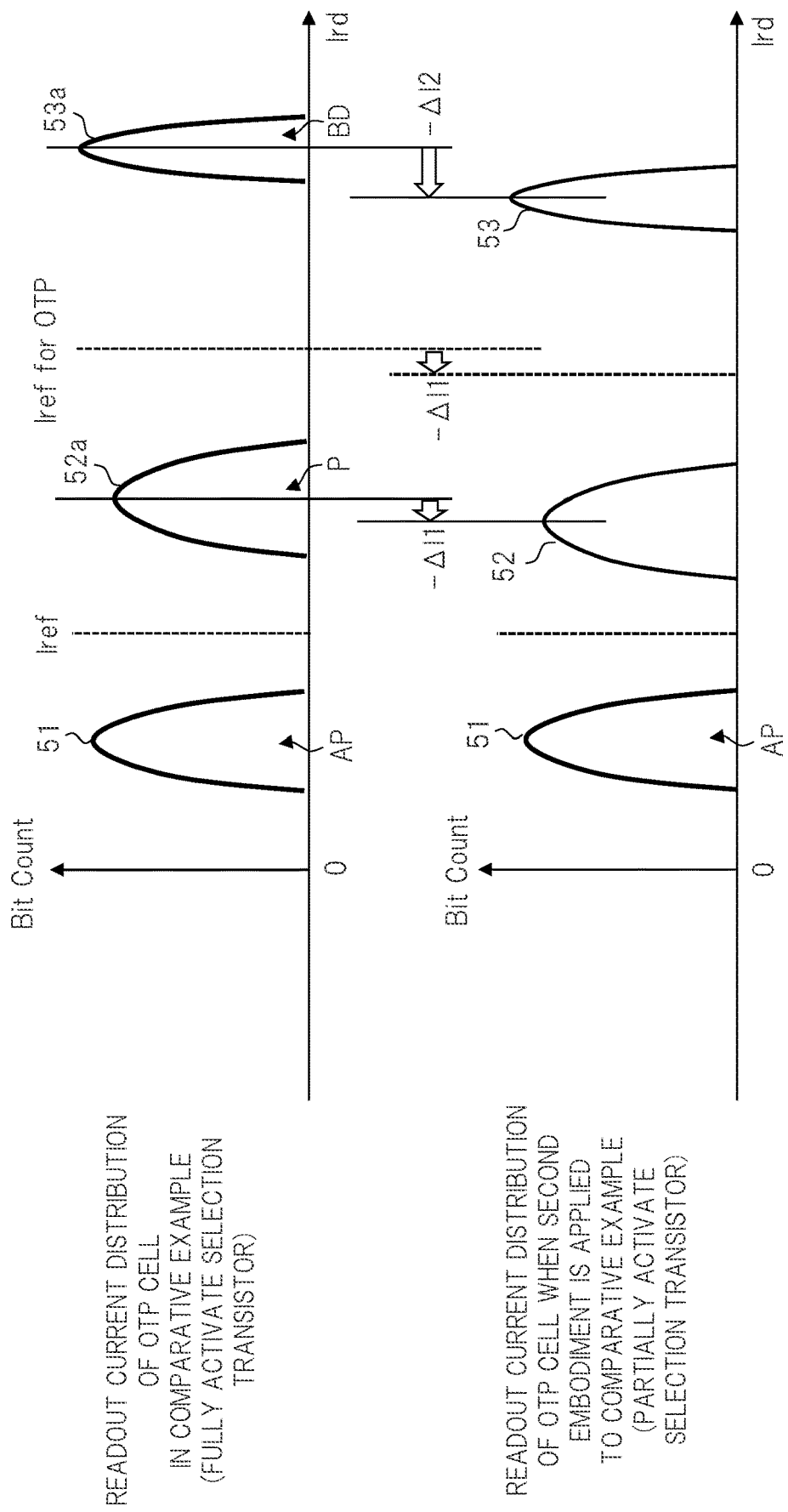

FIG. 9

| ACTION | NUMBER OF ELEMENTS OF SELECTION TRANSISTOR, WHICH TURN ON |
|---|---|
| MEMORY CELL READOUT | $i\ (i \geq 1)$ |
| MEMORY CELL WRITE | $i\ (i \geq 1)$ |
| OTP CELL READOUT | $i\ (i \geq 1)$ |
| OTP CELL WRITE | $j\ (j > i)$ |

| ACTION | NUMBER OF ELEMENTS OF SELECTION TRANSISTOR, WHICH TURN ON |
|---|---|
| OTP CELL READOUT (NORMAL MC/OTP MODE) | i (i≧1) |
| OTP CELL WRITE (NORMAL MC MODE) | i (i≧1) |
| OTP CELL WRITE (OTP MODE) | j (j>i) |

SEMICONDUCTOR DEVICE

CROSS-REFERENCE TO RELATED APPLICATIONS

The disclosure of Japanese Patent Application No. 2022-094430 filed on Jun. 10, 2022 including the specification, drawings and abstract is incorporated herein by reference in its entirety.

BACKGROUND

The present invention relates to a semiconductor device, and for example, relates to a semiconductor device including a variable resistance-type storage element such as a Magnetoresistive Random Access Memory (MRAM).

There is disclosed a technicaue listed below.

[Non-Patent Document 1] Yu-Der Chih et al., "13.3 A 22 nm 32 Mb Embedded STT-MRAM with 10 ns Read Speed, 1M Cycle Write Endurance, 10 Years Retention at 150° C. and High Immunity to Magnetic Field Interference", 2020 ISSCC, pp. 222-224

For example, Non-Patent Document 1 describes a configuration example of a readout circuit in Spin Transfer Torque (STT)-MRAM. The readout circuit includes: a clamp element that applies a readout potential to a cell resistance and a reference resistance; a pMOS cross couple-type sense amplifier; and a precharge element that precharges a differential pair node of the sense amplifier. After being precharged, the sense amplifier amplifies a potential difference of the differential pair node discharged through the cell resistance and the reference resistance.

In recent years, as an internal memory in a semiconductor device such as a Micro Controller Unit (MCU) and a System on a C (SoC), MRAM, and specifically, STT-MRAM has attracted attention. For example, in comparison with conventional MRAM and flash memory, STT-MRAM can obtain an advantage from a viewpoint of microfabrication, in other words, scaling, and the like. In usual, MRAM includes a memory cell including a variable resistance-type storage element that is rewritable, and stores data depending on whether the storage element is in a low resistance state or a high resistance state.

Meanwhile, as a memory cell for use in security, a One Time Programmable (OTP) cell is known. For example, when a current large enough to cause a dielectric breakdown is flown through the storage element such as the MRAM, a resistance value of the storage element can be irreversibly fixed to a value much lower than a value in the low resistance state. The OTP cell can be achieved by using this property. Moreover, at the time of a readout operation for the OTP cell, a readout potential is applied to the OTP cell by using a clamp element, and a cell current flowing through the OTP cell is detected. At this time, a cell current much larger than in the low resistance state can flow. As a result, it has been apprehended that a circuit area of the clamp element may increase.

Other objects and novel features will be apparent from the description in the specification and the accompanying drawings.

SUMMARY

A semiconductor device according to an embodiment includes a bit line, first and second memory cells, a clamp element, a reference current source, a sense amplifier, and an offset current source. The first memory cell is connected to the bit line and includes a first storage element of a variable resistance type. The second memory cell is connected to the bit line, includes a second storage element having the same electrical characteristics as the first storage element, and is used as an OTP cell. The clamp element applies a fixed potential to the bit line at a time of a readout operation. The reference current source generates a reference current. The sense amplifier applies the fixed potential to the first memory cell or the second memory cell at the time of the readout operation to detect, by using the reference current, a magnitude of a cell current flowing through the bit line. The offset current source is activated at a time of the readout operation for the second memory cell, and at a time of being activated, generates an offset current to be subtracted from the cell current. Herein, at the time of the readout operation for the second memory cell, the sense amplifier detects a magnitude relationship between the reference current and a readout current obtained by subtracting the offset current from the cell current.

The semiconductor device according to the embodiment is used, so that, in a variable resistance-type nonvolatile memory including the OTP cell, it becomes possible to suppress the increase of the area in the clamp element that determines the readout potential.

BRIEF DESCRIPTION OF THE DRAWINGS

FIG. 5 is a diagram for explaining an operation example of the readout circuit shown in FIG. 3.

FIG. 7A is a diagram for explaining an example of an assumed problem in a semiconductor device according to a second embodiment.

FIG. 7B is a diagram showing an example of a readout current distribution of the OTP cell when a method of the second embodiment is applied to a method of a comparative example in a semiconductor device according to a third embodiment.

FIG. 9 is a diagram for explaining an operation example when the configuration examples shown in FIGS. 8A and 8B are used.

DETAILED DESCRIPTION

Figure 1:
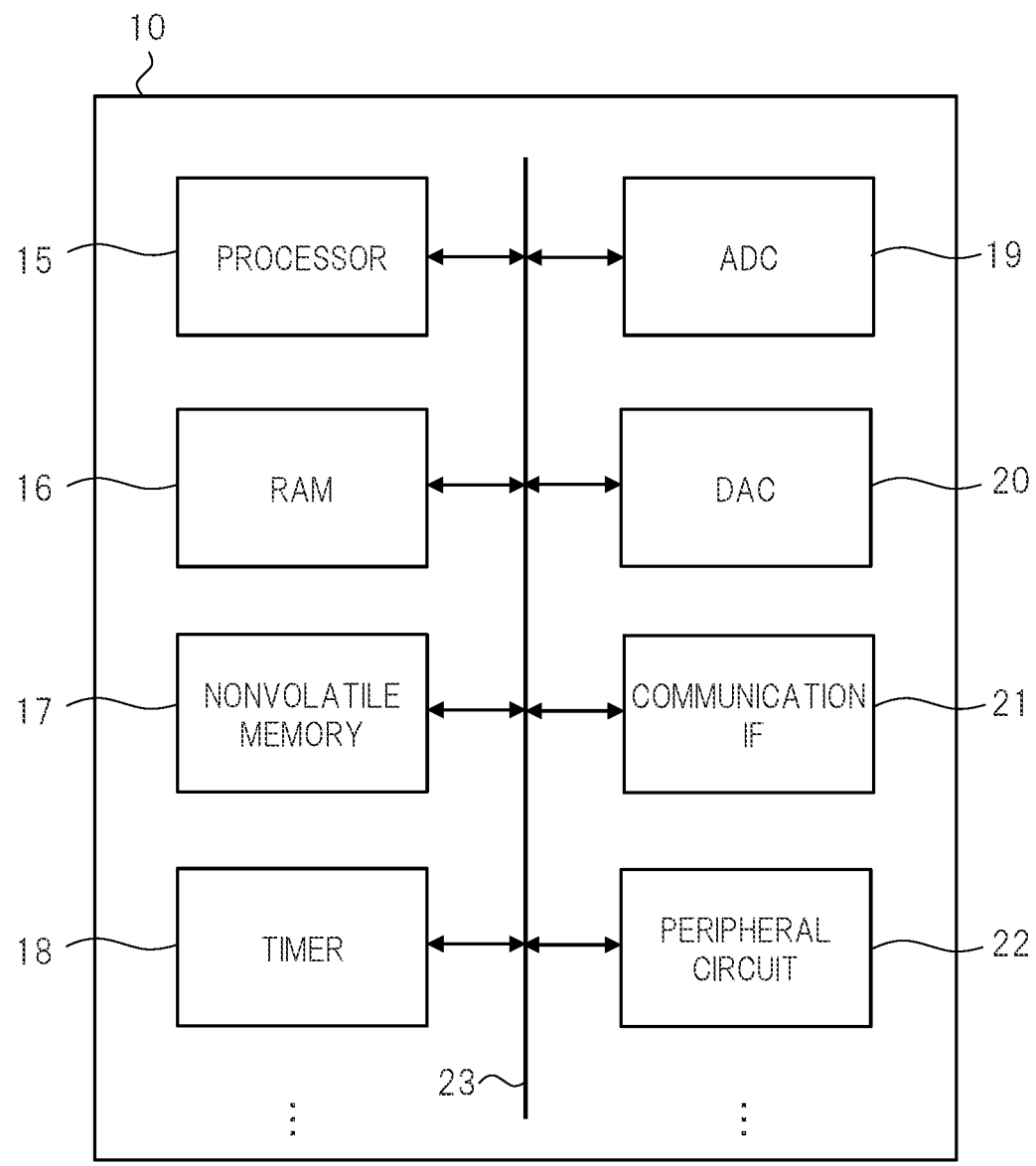
FIG. 1 is a block diagram showing a configuration example of a main portion in a semiconductor device according to a first embodiment.

When a necessity for convenience arises, the following embodiment will be described while being divided into a plurality of sections or embodiments. Unless otherwise clearly stated, the divided sections or embodiments have a mutual relationship. One of the sections or the embodiments is a modification, detail, supplementary explanation or the like of a part or whole of the other. Moreover, in the following embodiment, when the number of elements and the like (including the number, a numerical value, an amount, a range and the like) are mentioned, the number is not limited to a specific number and may be equal to or more or equal to or less than the specific number unless otherwise clearly stated or unless the number is limited to the specific number obviously in principle.

Furthermore, in the following embodiment, needless to say, constituents (also including element steps and the like) thereof are not necessarily essential unless otherwise clearly stated or unless the components are considered essential obviously in principle. Similarly, in the following embodiment, when shapes, positional relationships and the like of the constituents are mentioned, those substantially approximate or similar thereto are included therein unless otherwise clearly stated or unless those are obviously considered in principle to correspond to the shapes, the positional relationships and the like. This matter also applies to the above-described numerical value and range.

Moreover, circuit elements which constitute the respective functional blocks of embodiments are not particularly limited, but are formed on a semiconductor substrate, which is made of such as single crystal silicon, by a technology for an integrated circuit such as a well-known Complementary MOS transistor (CMOS). In the embodiments, as an example of a Metal Insulator Semiconductor Field Effect Transistor (MISFET), a Metal Oxide Semiconductor Field Effect Transistor (MOSFET), which is abbreviated as a MOS transistor, is used, but a non-oxide film is not eliminated as a gate insulating film. In the embodiments, p-channel-type MOSFET is called pMOS transistor MP, and n-channel-type MOSFET is called nMOS transistor MN. In the drawings, the connection of the substrate potential of the MOS transistor is not particularly specified, but a connection method thereof is not particularly limited as long as the MOS transistor can operate normally.

Hereinafter, embodiments will be described in detail with reference to the drawings. Note that, in all the drawings for explaining the embodiments, the same reference numerals are assigned to members having the same functions, and repeated descriptions thereof will be omitted. Moreover, in the following embodiments, unless particularly necessary, the description of the same or similar portions will not be repeated in principle.

First Embodiment

Overview of Semiconductor Device and Nonvolatile Memory

FIG. 1 is a block diagram showing a configuration example of a main portion in a semiconductor device according to a first embodiment. A semiconductor device 10 shown in FIG. 1 is composed of one semiconductor chip, and for example, is an MCU, an SoC, or the like. This semiconductor device 10 is used, for example, for the purpose of Internet of Things (IoT) or the like.

The semiconductor device 10 shown in FIG. 1 includes a processor 15, a RAM 16, a nonvolatile memory 17, a timer 18, an Analog-to-Digital Converter (ADC) 19, a Digital-to-Analog Converter (DAC) 20, a communication interface 21 and a variety of peripheral circuits 22, and a bus 23 that connects these to one another. The processor 15 is a Central Processing Unit (CPU), a Graphics Processing Unit (GPU), or the like. The RAM is a volatile memory such as a DRAM and an SRAM.

The communication interface 21 may be, for example, a MAC interface of the Ethernet (registered trademark), or the like. The nonvolatile memory 17 is, for example, an STT-MRAM, or the like. The nonvolatile memory 17 is used in some cases for storing a program to be executed in the processor 15, or is used in some cases as a memory for work of the processor 15. Note that the nonvolatile memory 17 is not limited to the MRAM, and just needs to include a variable resistance-type storage element.

Herein, for example, there is known a rollback attack that weakens security by rolling back a version of communication protocol or the like. As countermeasures against such a rollback attack, mentioned is a method of mounting, on the nonvolatile memory 17, a version counter for managing a version of communication. It is necessary that the version counter be achieved by an OTP cell capable of only one time write in order to prevent rewrite.

Figure 2A:
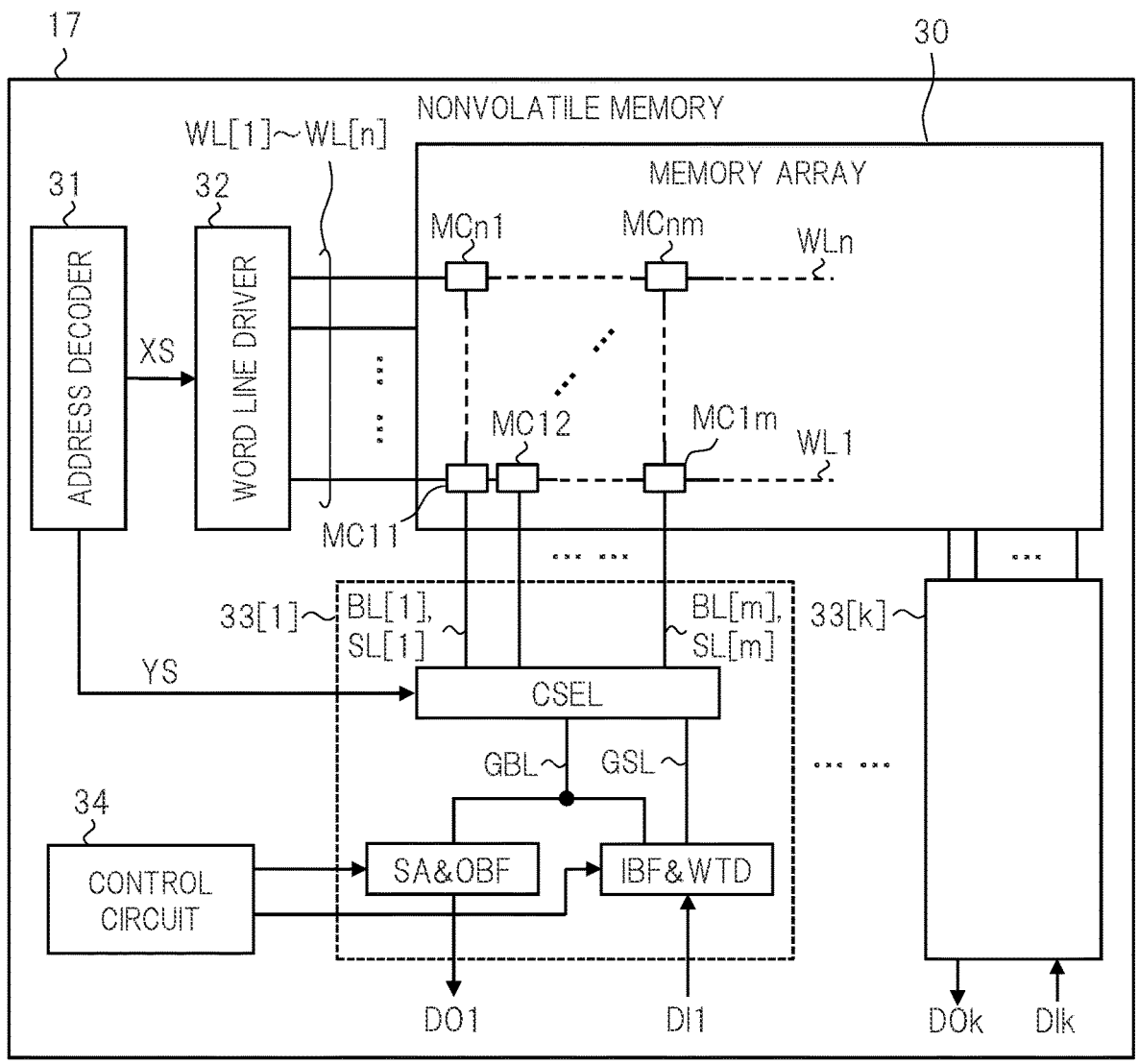
FIG. 2A is a block diagram showing a configuration example of a main portion of a nonvolatile memory in FIG. 1.
Figure 2B:
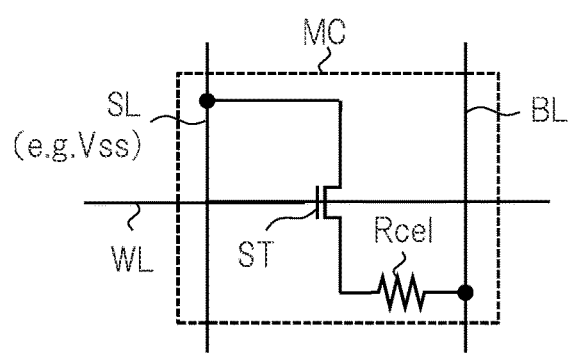
FIG. 2B is a circuit diagram showing a configuration example of a memory cell in FIG. 2A.

FIG. 2A is a block diagram showing a configuration example of a main portion of the nonvolatile memory in FIG. 1. FIG. 2B is a circuit diagram showing a configuration example of a memory cell in FIG. 2A. The nonvolatile memory 17 shown in FIG. 2A includes a memory array 30, a word line driver 32, a plurality, herein, k pieces of read/write circuits 33[1] to 33[k], an address decoder 31, and a control circuit 34.

The memory array 30 includes a plurality, herein, n pieces of word lines WL[1] to WL[n]. Moreover, corresponding to one read/write circuit, for example, to the read/write circuit 33[1], the memory array 30 includes a plurality, herein, m pieces of bit lines BL[1] to BL[m], m pieces of source lines SL[1] to SL[m], and a plurality, herein, n×m pieces of memory cells MC11 to MCnm. In the specification, the plurality of word lines WL[1] to WL[n] are collectively referred to as word lines WL. The plurality of bit lines BL[1] to BL[m] are collectively referred to as bit lines BL. The plurality of source lines SL[1] to SL[m] are collectively referred to as source lines SL. The plurality of memory cells MC11 to MCnm are collectively referred to as memory cells MC.

Note that, herein, corresponding to the m pieces of bit lines BL[1] to BL[m], m pieces of source lines SL[1] to SL[m] for writing are provided. However, for achieving densification, there is also a case where two memory cells MC share one source line, and the number of source lines provided in this case is m/2. Moreover, though not shown, specifically, corresponding to the k pieces of read/write circuits 33[1] to 33[k], the bit lines BL, of which number is m×k pieces, are provided, and the memory cells MC, of which number is n×m×k pieces, are provided.

The plurality of word lines WL[1] to WL[n] are arranged side by side in a row direction, and extend toward a column direction that intersects, for example, is perpendicular to the row direction. Meanwhile, the plurality of bit lines BL[1] to BL[m] are arranged side by side in the column direction, and extend toward the row direction. The plurality of memory cells MC are individually arranged on intersections of the plurality of word lines WL and the plurality of bit lines BL. For example, the memory cell MCnm is arranged on an intersection of the word line WL[n] and the bit line BL[m].

As shown in FIG. 2B, the memory cell MC includes a variable resistance-type storage element Rcel and a selection transistor ST, which are connected in series to each other between the bit line BL and the source line SL. At the time of the readout operation, a ground potential Vss that is a low potential-sided power supply potential is applied to the source line SL. The storage element Rcel is connected to the bit line BL, and for example, stores data, which is different depending on whether the storage element Rcel is in the low resistance state or the high resistance state, by using a Magnetic Tunnel Junction (MTJ) as a constituent.

Specifically, in the MTJ, a pinned layer and a free layer are provided with a tunnel barrier film sandwiched therebetween. A magnetization orientation of the free layer changes according to a direction of a current flown at the time of a write operation. A state in which the pinned layer and the free layer have the same magnetization is referred to as a P state, and a state in which the pinned layer and the free layer have opposite magnetization orientations is referred to as an AP state. The P state is the low resistance state, and the AP state is the high resistance state. The selection transistor ST is, for example, an nMOS transistor, and is connected to between the source line SL and the storage element Rcel. Moreover, the selection transistor ST has a control node, for example, a gate connected to the word line WL, and is controlled to be ON/OFF by the word line WL.

In the case of changing the storage element Rcel from the AP state that is the high resistance state to the P state that is the low resistance state, then in a state in which the selection transistor ST is in an ON state, the source line SL applied with the ground potential Vss is taken as a reference, a write potential of a positive electrode, which is, for example, such as +0.4 V, is applied to the bit line BL, and a write current is flown from the bit line BL to the source line SL through the storage element Rcel. Meanwhile, in the case of changing the storage element Rcel from the P state to the AP state, then in a state in which the selection transistor ST is in the ON state, the bit line BL applied with the ground potential Vss is taken as a reference, the write potential of the positive electrode, which is, for example, such as +0.4 V, is applied to the source line SL, and the write current is flown from the source line SL to the bit line BL through the storage element Rcel.

Moreover, at the time of the readout operation, the cell current flowing through the storage element Rcel is determined in a state in which the ground potential Vss is applied to the source line SL and a readout potential of +0.1 V or the like, which is lower than that at the time of a write operation, is applied to the storage element Rcel through the bit line BL. At this time, for example, a reference current having an intermediate value between a value of a cell current in the AP state and a value of a cell current in the P state is generated in advance, and this reference current and the cell current flowing through the storage element Rcel are compared with each other.

Returning to FIG. 2A, on the basis of a word line selection signal XS output from the address decoder 31, the word line driver 32 selects any one from among the plurality of word lines WL[1] to WL[n], and applies a potential, which serves for controlling the selection transistor ST to be ON, to the selected word line WL. Each of the plurality of read/write circuits 33[1] to 33[k], the read/write circuit 33[1] as a representative thereof includes a column selector CSEL, and a readout circuit and a write circuit. The readout circuit includes a sense amplifier SA and an output buffer OBF. The write circuit includes an input buffer IBF and a write driver WTD.

At the time of a readout operation, the column selector CSEL selects any one among the m pieces of bit lines BL on the basis of a bit line selection signal YS output from the address decoder 31. The column selector CSEL connects the selected one bit line BL to a global bit line GBL. By using the above-mentioned reference current, the sense amplifier SA detects a magnitude of a current flowing through the global bit line GBL, and eventually, of a cell current flowing through the selected memory cell MC. The output buffer OBF latches a sensing signal output from this sense amplifier SA, thereby outputting a latch result as readout data DO1.

Meanwhile, at the time of the write operation, the column selector CSEL selects one bit line BL and one source line SL from among the m pieces of bit lines BL and the m pieces of source lines SL on the basis of the selection signal YS output from the address decoder 31. The column selector CSEL connects the selected one bit line BL and one source line SL to the global bit line GBL and the global source line GSL, respectively.

The input buffer IBF latches write data DI' output from the outside. The write driver WTD writes the P state, the AP state or the like into the selected memory cell MC through the global bit line GBL and the global source line GSL on the basis of a logic level of the data latched by the input buffer IBF. That is, the write driver WTD generates a write current or a write potential, which corresponds to the P state or the AP state, and applies the write current or the write potential to the global bit line GBL and the global source line GSL.

The read/write circuits 33[2] to 33[k] also have a similar configuration to that of the read/write circuit 33[1], and performs a similar operation to that thereof. As a result, the read/write circuits 33[2] to 33[k] output data, which are stored by the selected memory cells MC located on the same word lines WL, as the readout data DO2 to DOk, respectively. Moreover, the read/write circuits 33[2] to 33[k] write write data DI2 to DIk, which come from the outside, to the selected memory cells MC.

The control circuit 34 controls a variety of timing of the entire nonvolatile memory 17. The control circuit 34 controls, as a part of the timing, timing of activating the sense amplifier SA and the write driver WTD, latch timing in the output buffer OBF and the input buffer IBF, and the like. Note that, in the specification, the read/write circuits 33[1] to 33[k] are collectively referred to as read/write circuits 33. The readout data DO1 to DOk are collectively referred to as readout data DO. The write data DI1' to DIk are collectively referred to as write data DI.

Herein, as mentioned above, the nonvolatile memory 17 may sometimes be required to mount the OTP cell thereon. Accordingly, in the memory array 30, it is beneficial to assign the memory cell MC, which is predetermined and partial, to the OTP cell. Thus, while suppressing an increase of a circuit area, and the like, for example, in comparison with the case of separately providing a circuit region exclusive for the OTP cell, it becomes possible to mount the OTP cell on the nonvolatile memory 17.

Thus, when a write potential, for example, such as +1.4 V, which is sufficiently higher than +0.4 V that is a write potential to the P state, is applied to the OTP cell, then due to a dielectric breakdown, the storage element is brought into a state in which a resistance value is lower than in the P state. In the specification, a state of the OTP cell to which such write is performed is referred to as a Breakdown (BD) state. Unlike the P state/AP state, the BD state is an irreversible state.

Details of Readout Circuit

Method of Embodiments

Figure 3:
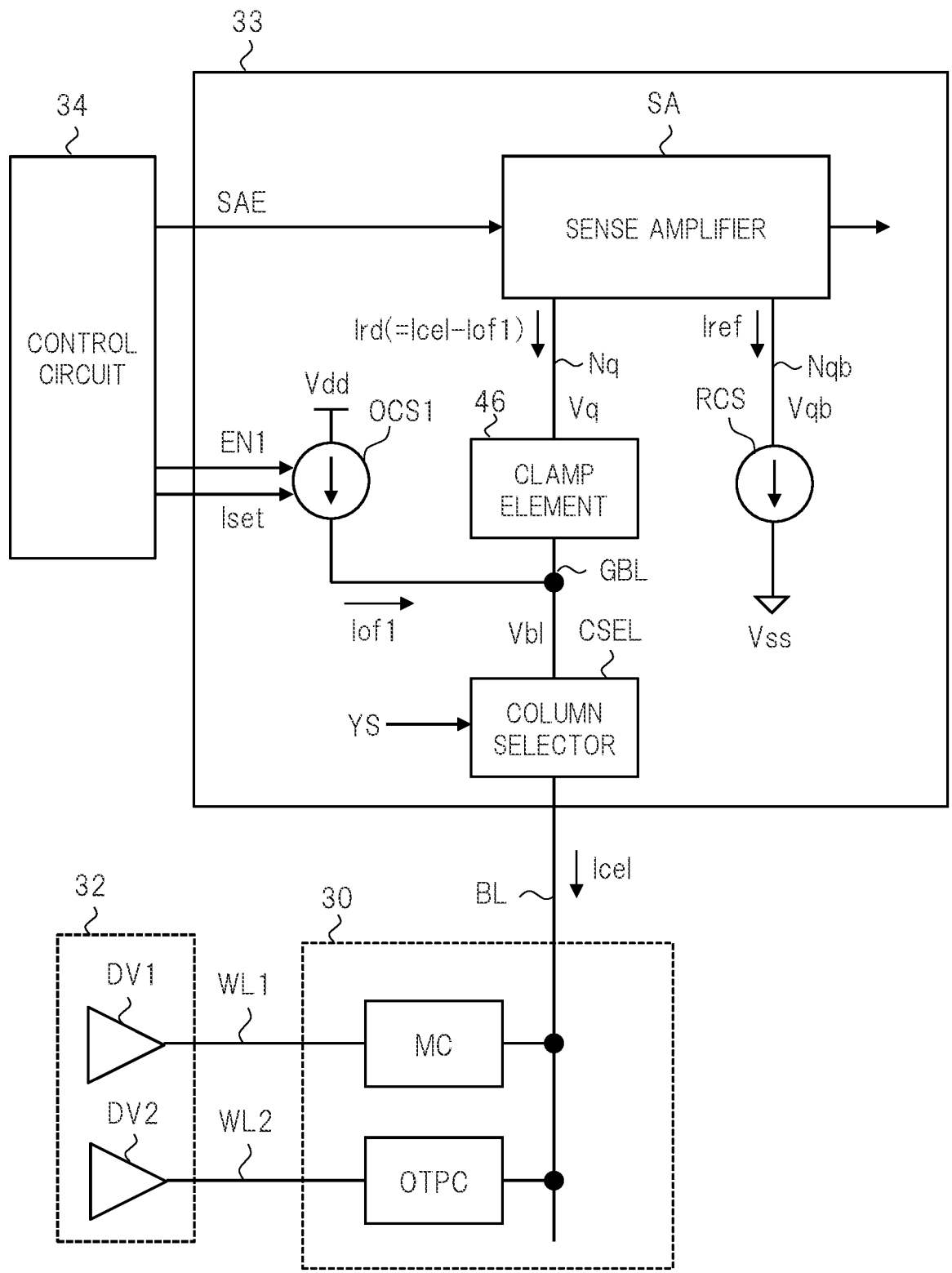
FIG. 3 is a schematic diagram showing a configuration example of a main portion of a readout circuit in FIG. 2A.

FIG. 3 is a schematic diagram showing a configuration example of a main portion of the readout circuit in FIG. 2A. FIG. 3 shows a part of the memory array 30, a part of the word line driver 32, a part of the readout circuit in the read/write circuit 33, and the control circuit 34, all of which are shown in FIG. 2A. In FIG. 3, the memory array 30 includes an OTP cell OTPC in addition to the memory cell MC.

As shown in FIG. 2B, the memory cell MC includes the variable resistance-type storage element Rcel and the selection transistor ST, which are connected between the bit line BL and the source line SL. Although not shown, at the time of the readout operation, the ground potential Vss is applied to the source line SL. When the word line WL1 is activated, the selection transistor ST in this memory cell MC forms a current path between the storage element Rcel and the bit line BL. Likewise, the OTP cell OTPC also includes a variable resistance-type storage element having the same electrical characteristics as those of the storage element Rcel in the memory cell MC, and the selection transistor ST, both of which are connected to the bit line BL. The selection transistor ST in this OTP cell OTPC forms a current path between the storage element and the bit line BL when a word line WL2 is activated.

The word line driver 32 includes driver circuits DV1 and DV2. The driver circuit DV1 applies a drive potential to the word line WL1, thereby activating the word line WL1, and controlling the selection transistor ST in the memory cell MC to be ON. Moreover, the driver circuit DV1 applies the ground potential VSS or the like to the word line WL1, thereby deactivating the word line WL1, and controlling the selection transistor ST in the memory cell MC to be OFF. Likewise, the driver circuit DV2 activates/deactivates the word line WL2, thereby controlling ON/OFF of the selection transistor ST in the OTP cell OTPC.

The read/write circuit 33 includes the column selector CSEL, a clamp element 46, the sense amplifier SA, a reference current source RCS, and an offset current source OCS1. When the bit line BL is selected by the bit line selection signal YS mentioned in FIG. 2A, the column selector CSEL connects the bit line BL to a node Nq through the clamp element 46.

On the premise that the column selector CSEL is in a connection state, the clamp element 46 is connected between the node Nq and the bit line BL, and specifically, the global bit line GBL. At the time of the readout operation, the clamp element 46 applies the readout potential, which is a fixed potential, to the bit line BL through the column selector CSEL. That is, when a potential Vq of the node Nq and a bit line potential Vbl are in a relationship of Vq>Vbl, the clamp element 46 clamps the bit line potential Vbl to the readout potential regardless of the potential Vq of the node Nq.

The reference current source RCS generates a reference current Iref, and flows this reference current Iref to a node Nqb. At the time of the readout operation, by using the reference current Iref, the sense amplifier SA detects a magnitude of a cell current Icel that flows through the bit line BL by applying the readout potential to the memory cell MC or the OTP cell OTPC.

On the premise that the offset current source OCS1 is connected between a high potential-sided power supply potential Vdd and the global bit line GBL, and that the column selector CSEL is in a connection state, the offset current source OCS1 is connected between the high potential-sided power supply potential Vdd and the bit line. At the time of a readout operation for the OTP cell OTPC, the offset current source OCS1 is activated by an enable signal EN1, and at the time of being activated, generates an offset current Iof1, which is to be subtracted from the cell current Icel by the OTP cell OTPC, on the basis of a current value setting signal Iset. With this, at the time of the readout operation for the OTP cell OTPC, the sense amplifier SA detects a magnitude relationship between the reference current Iref and a readout current Ird obtained by subtracting the offset current Iof1 from the cell current Icel.

The control circuit 34 generates a sense amplifier enable signal SAE for controlling the activation/deactivation of the sense amplifier SA, and outputs the generated sense amplifier enable signal SAE to the sense amplifier SA. Moreover, the control circuit 34 generates the enable signal EN1 for controlling the activation/deactivation of the offset current source OCS1, and outputs the generated enable signal EN1 to the offset current source OCS1. Further, the control circuit 34 generates the current value setting signal Iset for determining the current value of the offset current Iof1, and outputs the generated current value setting signal Iset to the offset current source OCS1.

Note that the offset current source OCS1 is deactivated at the time of the readout operation for the memory cell MC. In this case, the readout current Ird becomes equal to the cell current Icel by the memory cell MC. At the time of the readout operation for the memory cell MC, the sense amplifier SA detects a magnitude relationship between the reference current Iref and the readout current Ird that becomes equal to this cell current Icel.

Figure 4:
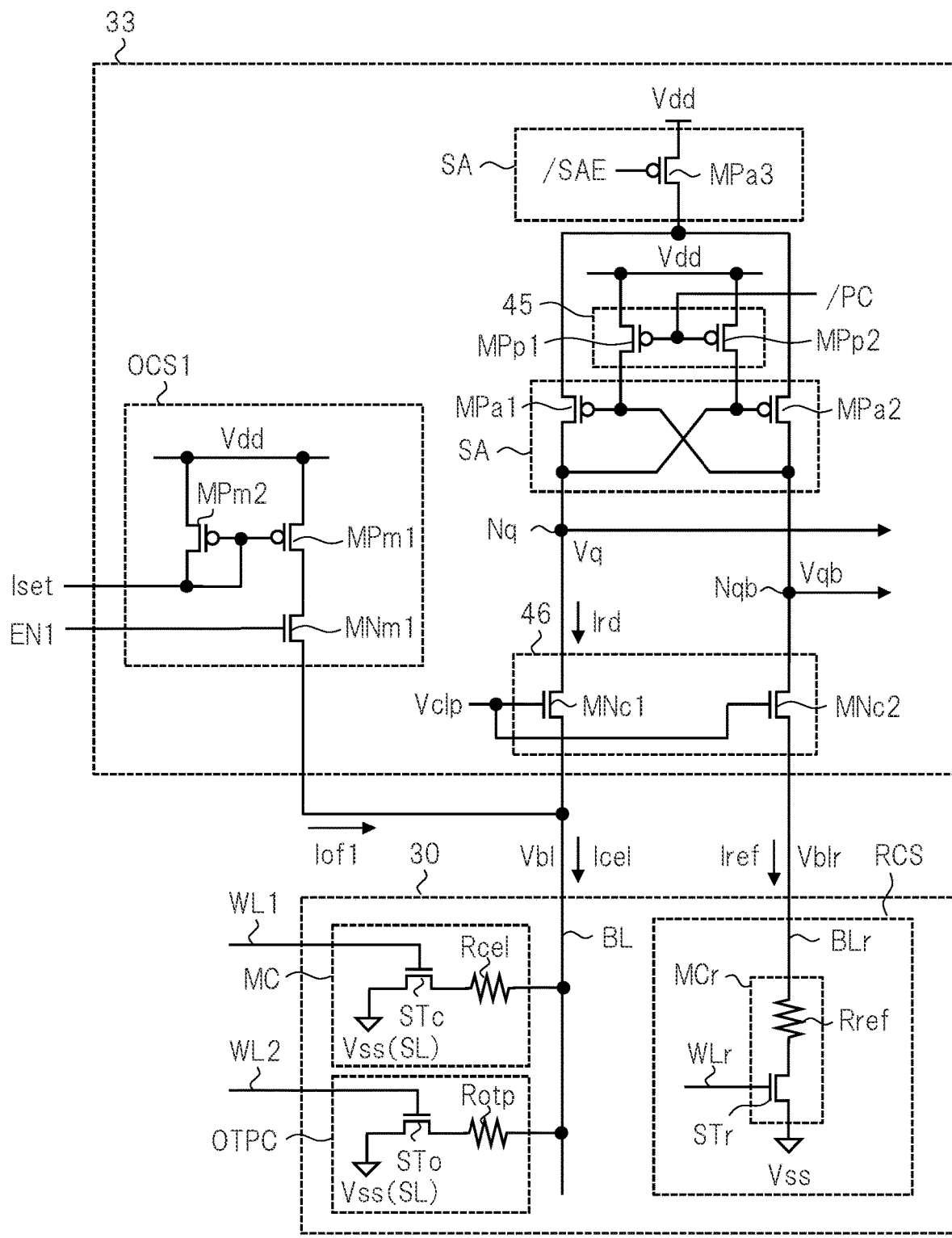
FIG. 4 is a circuit diagram showing a detailed configuration example of the readout circuit shown in FIG. 3.

FIG. 4 is a circuit diagram showing a detailed configuration example of the readout circuit shown in FIG. 3. In FIG. 4, the memory cell MC includes the storage element Rcel and a selection transistor STc for the memory cell MC. Meanwhile, the OTP cell OTPC includes a storage element Rotp having the same electrical characteristics as those of the storage element Rcel, and a selection transistor STo for the OTP cell OTPC.

At the time of a write operation for the OTP cell OTPC, a larger write current is required in comparison with that at the time of the write operation for the memory cell MC.

Therefore, the selection transistor STo may be composed, for example, by connecting, in parallel, a plurality of the same elements as those of the selection transistor STc. Although not shown, the column selector CSEL is connected between the clamp element 46, and the memory cell MC and the OTP cell OTPC.

The reference current source RCS is composed, for example, of a reference memory cell MCr. The reference memory cell MCr includes a reference resistor element Rref and a selection transistor STr for reference. The reference resistor element Rref has an intermediate resistance value between a resistance value of the P state and a resistance value of the AP state. The selection transistor STr for reference is controlled by a reference word line WLr. At the time of the readout operation, the reference word line WLr is also activated in addition to the word line WL. As a result, to a reference bit line BLr, the reference current Iref flows, which corresponds to the resistance value of the reference resistor element Rref.

The read/write circuit 33 includes the sense amplifier SA, a precharge circuit 45, the clamp element 46, and the offset current source OCS1. The clamp element 46 includes two nMOS transistors MNc1 and MNc2 which function as source followers. At the time of the readout operation, the clamp element 46 applies the readout potential to the storage element Rcel or the storage element Rotp through the bit line BL, and applies the readout potential to the reference resistor element Rref through the reference bit line BLr. At this time, the readout potential that becomes the fixed potential is determined by a clamp potential Vclp applied to gates of the nMOS transistors MNc1 and MNc2.

The offset current source OCS1 includes: a p-channel-type current mirror pair composed of two pMOS transistors MPm1 and MPm2; and an nMOS transistor MNm1. The offset current source OCS1 is connected between the power supply potential Vdd and the bit line BL. In the offset current source OCS1, when the enable signal EN1 is activated, the nMOS transistor MNm1 turns ON, and the offset current Iof1 that is based on the current value setting signal Iset input to the current mirror pair flows to the bit line BL. In this example, a current mirror circuit is composed by using the pMOS transistor MPm1 as a mirror destination and the pMOS transistor MPm2 as a mirror source.

Drains of the nMOS transistors MNc1 and MNc2 which constitute the clamp element 46 are connected to the nodes Nq and Nqb, respectively. To the node Nqb, the reference current Iref flows, which is generated by applying the readout potential to the reference resistor element Rref. Meanwhile, to the node Nq, the readout current Ird flows.

At the time of the readout operation for the memory cell MC, that is, when the offset current source OCS1 is inactive, the readout current Ird becomes equal to the cell current Icel. Meanwhile, at the time of the readout operation for the OTP cell OTPC, that is, when the offset current source OCS1 is active, the readout current Ird becomes equal to the current obtained by subtracting the offset current Iof1 from the cell current Icel. Note that, specifically, as shown in FIG. 3, the clamp element 46 is connected to the bit line BL and the reference bit line BLr through the column selector CSEL.

The precharge circuit 45 includes two pMOS transistors MPp1 and MPp2, which have sources applied with the power supply potential Vdd. The precharge circuit 45 precharges the nodes Nq and Nqb to the power supply potential Vdd. Specifically, the pMOS transistors MPp1 and MPp2 turn ON during a low level period of an inverted precharge signal/PC, and precharge the nodes Nqb and Nq connected to drains thereof. The inverted precharge signal/PC is generated by the control circuit 34 shown in FIG. 2.

The sense amplifier SA includes: a p-channel-type transistor pair composed of two pMOS transistors MPa1 and MPa2; and a pMOS transistor MPa3. After the precharge by the precharge circuit 45, the sense amplifier SA amplifies a potential difference between the potential Vq of the node Nq and a potential Vqb of the node Nqb, the potential difference being generated after a discharge period by the readout current Ird and the reference current Iref.

Specifically, gates of the pMOS transistors MPa1 and MPa2 are connected to the Nodes Nqb and Nq, respectively. The pMOS transistors MPa1 and MPa2 perform differential amplification by cross-coupled connection in which the gate of one thereof is connected to a drain of the other thereof. The pMOS transistor MPa3 applies the power supply potential Vdd to sources of the pMOS transistors MPa1 and MPa2 in a high level period of the sense amplifier enable signal SAE, that is, a low level period of an inverted sense amplifier enable signal/SAE. Thus, the pMOS transistor MPa3 activates the sense amplifier SA.

Note that, in the example of FIG. 4, the reference current source RCS is composed of: an nMOS transistor MNc2 disposed in the readout circuit 33; and the reference memory cell MCr disposed in the memory array 30. But not limited to this, the reference current source RCS can also be configured by disposing the reference memory cell MCr in the readout circuit 33. Moreover, the reference current source RCS can also be configured by using only the nMOS transistor without using the reference resistor element Rref.

Moreover, in the example of FIG. 4, the offset current source OCS1 is composed of three transistors, which are the pMOS transistors MPm1 and MPm2 and the nMOS transistor MNm1. But not limited to this, for example, the offset current source OCS1 may be configured by disposing the pMOS transistor MPm2 that is a mirror source in the control circuit 34, and disposing the pMOS transistor MPm2 that is a mirror destination and the nMOS transistor MNm1 to each of the k pieces of read/write circuits 33. Thus, it is possible to substantially reduce the number of elements of the offset current source OCS1 to two.

Method of Comparative Example and Problem Thereof

Figure 11:
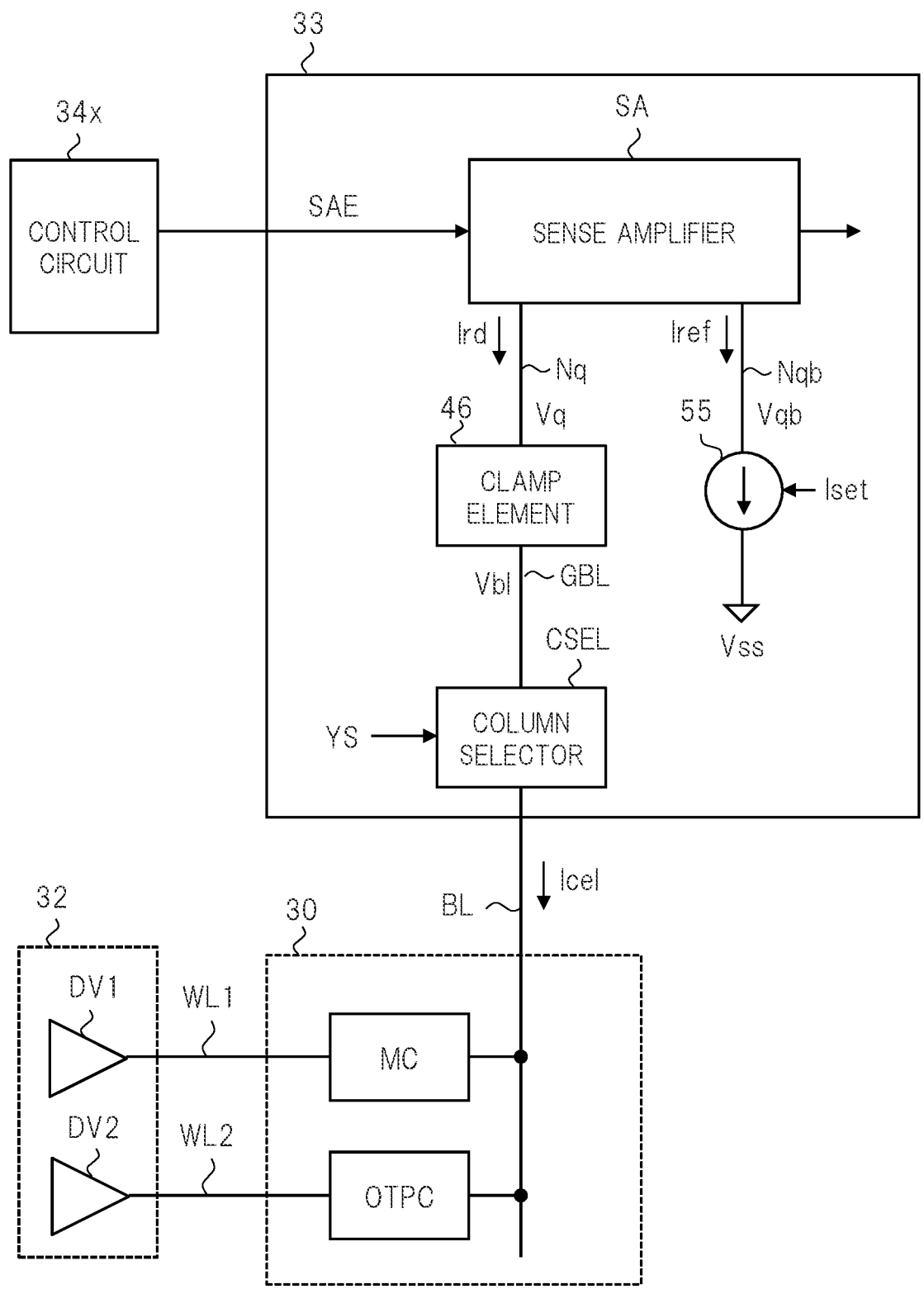
FIG. 11 is a schematic diagram showing a configuration example of a main portion of a readout circuit in a nonvolatile memory that serves as a comparative example.

FIG. 11 is a schematic diagram showing a configuration example of a main portion of a conventional readout circuit in a nonvolatile memory that serves as a comparative example. The conventional configuration example shown in FIG. 11 is different from the configuration example of the embodiment, which is shown in FIG. 3, in terms of the following two points. A first difference is that the offset current source OCS1 is not provided. A second difference is that a control circuit 34x does not output the current value setting signal Iset and the enable signal EN1 to the offset current source OCS1.

Figure 12:
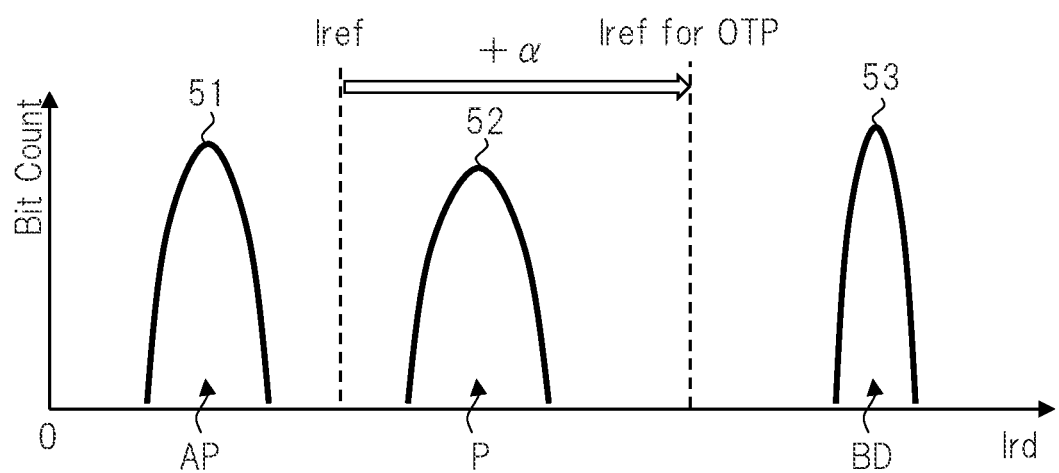
FIG. 12 is a diagram for explaining an operation example of the readout circuit shown in FIG. 11.

FIG. 12 is a diagram for explaining an operation example of the conventional readout circuit shown in FIG. 11. FIG. 12 shows an example of a distribution of the readout current Ird detected by the sense amplifier SA. In FIG. 12, at the time of the readout operation for the memory cell MC in the AP state that is the high resistance state, a distribution 51 of the readout current Ird is located in a range that represents a small current value. At the time of the readout operation for the memory cell MC in the P state that is the low resistance state, a distribution 52 of the readout current Ird is located in a range that represents a larger current value than the distribution 51. Meanwhile, at the time of the readout operation for the OTP cell OTPC in the BD state, a distribution 53 of the readout current Ird is located in a range that represents a larger current value than the distribution 52.

Accordingly, at the time of the readout operation for the memory cell MC in the AP state or the P state, the sense amplifier SA distinguishes whether the memory cell MC is in the AP state or the P state by using the reference current Iref set at an approximately intermediate current value between a current value in the AP state and a current value in the P state. Meanwhile, at the time of the readout operation for the OTP cell OTPC in the AP state/the P state or the BD state, the sense amplifier SA distinguishes whether or not the OTP cell OTPC is in the BD state, for example, by using the reference current Iref set at an approximately intermediate current value between the current value in the P state and a current value in the BD state. Therefore, at the time of the readout operation for the OTP cell OTPC, the reference current source 55 generates the reference current Iref that is increased by +a in accordance with the current value setting signal Iset.

However, when such a method as shown in FIG. 11 is used, for example, the following three problems can occur. As a first problem, it is apprehended that the area of the clamp element 46 may increase. As a second problem, it is apprehended that a timing control when the control circuit 34x outputs the sense amplifier enable signal SAE or outputs a precharge signal PC in FIG. 4 may be complicated. As a third problem, since it is necessary to increase the reference current Iref at the time of the readout operation for the OTP cell OTPC, it is apprehended that a power consumption in the sense amplifier SA may increase.

With regard to the first problem, if the clamp element 46 having a transistor size enough to flow the cell current Icel in the P state is provided, then the cell current Icel in the BD state becomes smaller than an original value, and it is apprehended that an interval between the distribution 52 and the distribution 53, which are shown in FIG. 12, may be narrowed. As a result, it is apprehended that an erroneous detection may occur in the sense amplifier SA.

More specifically, the cell current Icel is given by Equation (1) on the basis of the characteristics of the nMOS transistor MNc1 in the clamp element 46. In Equation (1), β, is a constant proportional to a value of W/L that represents a transistor size where W is a gate width of the nMOS transistor MNc1 and L is a gate length thereof. Moreover, Vclp is a clamp potential, Vbl is a bit line potential, and Vth is a threshold voltage of the nMOS transistor MNc1.

$$Icel=\beta \times (Vclp-Vbl-Vth) \qquad (1)$$

Moreover, the bit line potential Vbl is "R×Icel" where R is a combined resistance value of the resistance value of the storage element and the resistance value of the selection transistor. As a result, Equation (1) is modified like Equation (2). From Equation (2), it is understood that the cell current Icel is given by "(Vclp−Vth)/R" in an ideal state in which β is infinite. Meanwhile, it is understood that, when β is small, "1>>3×β" is established in a region where R is small, and the cell current Icel approaches "β×(Vclp−Vth)". This means that, when the transistor size of the clamp element 46 is too small, then for example, in FIG. 12, the distribution 53 when the resistance value is particularly small approaches the distribution 52.

$$Icel=\beta \times (Vclp-Vth)/(1+\beta \times R) \qquad (2)$$

With regard to the second problem, for example, as in the case of FIG. 4, a method is assumed, in which, after the nodes Nq and Nqb are precharged to the power supply potential Vdd, the nodes Nq and Nqb are discharged for a discharge period by the cell current Icel and the reference current Iref, and a potential difference "|Vq−Vqb|" at an ending time of the discharge period is amplified by the sense amplifier SA. In this case, in the configuration example shown in FIG. 11, a range of the discharge current differs between the time of the readout operation for the memory cell MC and the time of the readout operation for the OTP cell OTPC, and accordingly, in accordance with this difference, it is necessary to change at least the length of the discharge period.

That is, in order to perform a correct detection by the sense amplifier SA, it is necessary to activate the sense amplifier SA before the potentials Vq and Vqb of the nodes Nq and Nqb are discharged to a lower limit value, for example, the readout potential. However, a period required for this discharge to the lower value varies depending on a magnitude of the discharge current. In order to solve the first, second and third problems, which are explained herein, it is beneficial to use the above-mentioned configuration example of FIG. 3 as will be described below.

Details of Readout Operation

FIG. 5 is a circuit diagram for explaining an operation example of the readout circuit shown in FIG. 3. FIG. 5 shows an example of the distribution of the readout current Ird detected by the sense amplifier SA together with the distribution of the case of the comparative example shown in FIG. 12. As mentioned above, at the time of the readout operation for the OTP cell OTPC, the sense amplifier SA receives an input of the readout current Ird obtained by subtracting the offset current Iof1 from the cell current Icel.

As a result, as shown in FIG. 5, both of the distribution 52 of the readout current Ird in the P state in the comparative example and the distribution 53 of the readout current Ird in the BD state therein shift to smaller values by the amount of the offset current Iof1. Thus, as shown in FIG. 5, the sense amplifier SA can detect the readout currents Ird by using the reference currents Iref with the same value at the time of the readout operation for the memory cell MC and the readout operation for the OTP cell OTPC.

That is, at the time of the readout operation for the memory cell MC, the sense amplifier SA performs a similar operation to that in the case of the comparative example, and distinguishes the distribution 51 and the distribution 52 from each other by using the certain reference current Iref. Meanwhile, at the time of the readout operation for the OTP cell OTPC, unlike the case of the comparative example, the sense amplifier SA distinguishes the distribution 52 or the distribution 51 and the distribution 53 from each other by using the reference current Iref with the same value as that at the time of the readout operation for the memory cell MC.

As described above, at the time of the readout operation for the OTP cell OTPC, the readout current Ird is reduced by the offset current Iof1, so that, as a first effect, it becomes possible to suppress the increase of the area of the clamp element 46. That is, with regard to the first problem mentioned above, it is sufficient if the clamp element 46 is provided, which has a transistor size enough to flow not the cell current Icel in the BD state, but for example, the cell current Icel in the P state.

Moreover, as a second effect, it becomes possible to facilitate the timing control by the control circuit 34. That is, with regard to the above-mentioned second problem, the range of the discharge current can be equivalent between the time of the readout operation for the memory cell MC and the readout operation for the OTP cell OTPC, and accordingly, the length of the discharge period may also be the same. Moreover, as a third effect, since it is not necessary to increase the reference current Iref at the time of the readout operation for the OTP cell OTPC unlike the case of the comparative example, the increase of the power consumption in the sense amplifier SA can be suppressed.

Figure 6A:
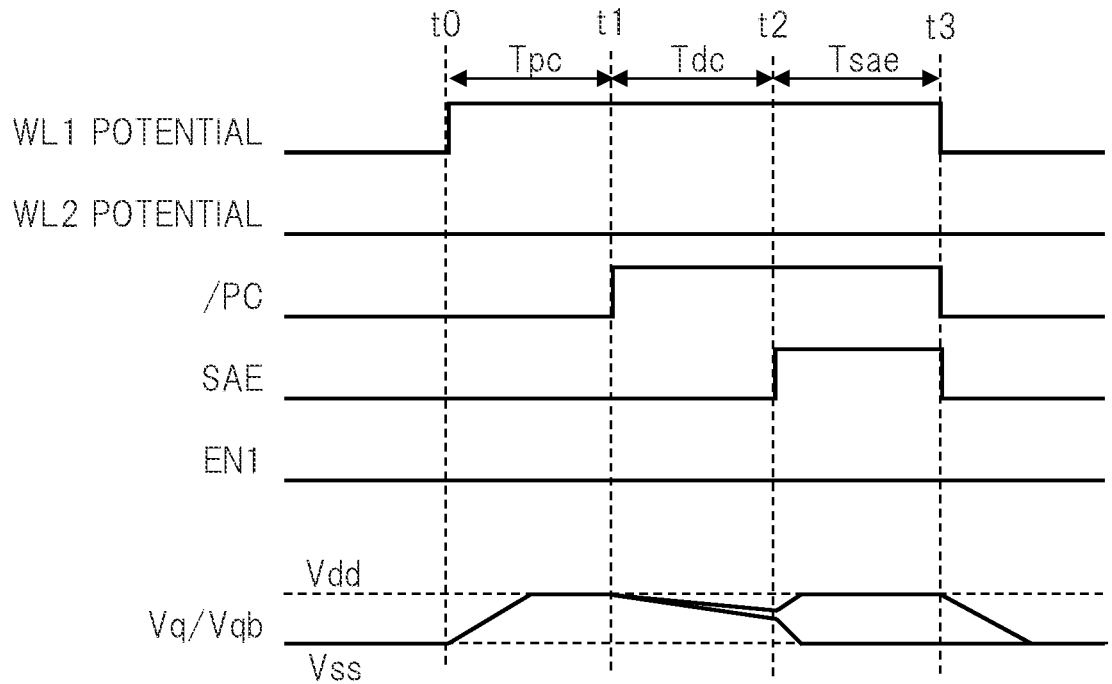
FIG. 6A is a waveform diagram showing an example of a readout operation for the memory cell, the readout operation using the readout circuit shown in FIGS. 3 and 4.
Figure 6B:
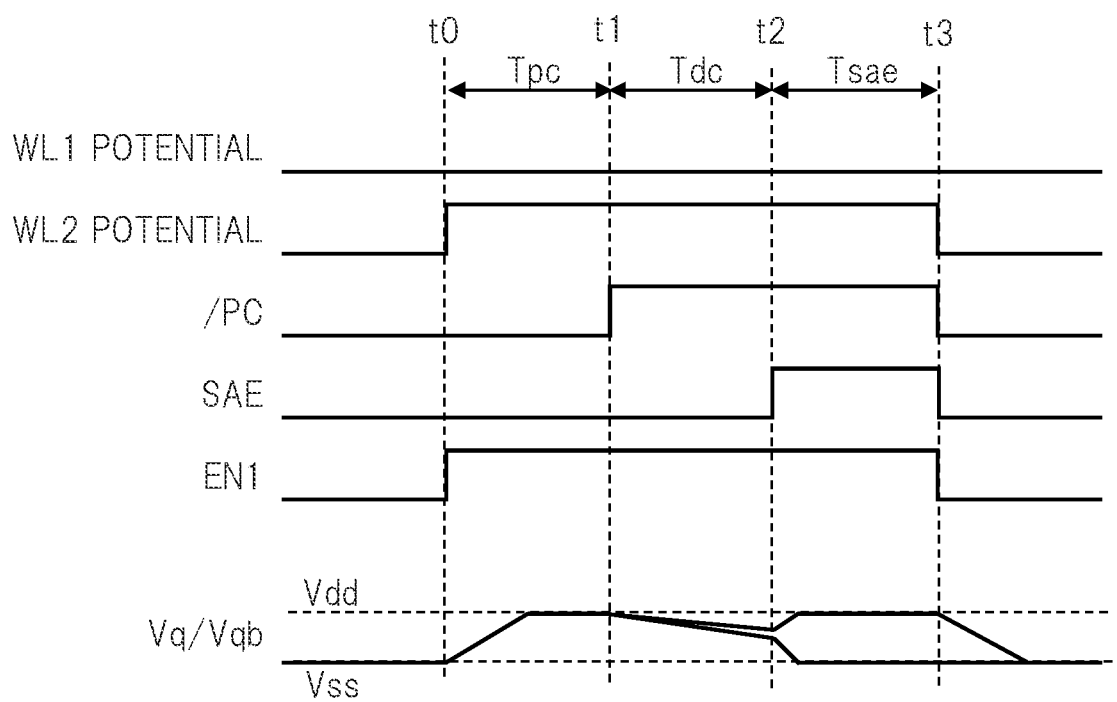
FIG. 6B is a waveform diagram showing an example of a readout operation for an OTP cell, the readout operation using the readout circuit shown in FIGS. 3 and 4.

FIG. 6A is a waveform diagram showing an example of the readout operation for the memory cell, the readout operation using the readout circuit shown in FIGS. 3 and 4. FIG. 6B is a waveform diagram showing an example of the readout operation for the OTP cell, the readout operation using the readout circuit shown in FIGS. 3 and 4. In FIGS. 6A and 6B, a period from time t0 to time t1 is a precharge period Tpc, a period from time t1 to time t2 is a discharge period Tdc, and a period from time t2 to time t3 is an amplification period Tsae or a detection period by the sense amplifier SA.

In FIG. 6A, first, at time t0, the word line WL1 for the memory cell MC is activated. Then, in the precharge period Tpc, the precharge circuit 45 is activated by a low level of the inverted precharge signal/PC, and more specifically, is activated by AND logic of the word line selection signal XS and the precharge signal PC. Thus, in the precharge period Tpc, the potentials Vq and Vqb of the nodes Nq and Nqb change from the ground potential Vss to the power supply potential Vdd.

Next, at time t1, the inverted precharge signal/PC shifts from the low level to the high level, so that the precharge circuit 45 is deactivated. Then, in the discharge period Tdc, the potentials Vq and Vqb of the nodes Nq and Nqb gradually decrease due to the discharge of the cell current Icel and the reference current Iref. Thereafter, at time t2 when the predetermined discharge period Tdc is ended, the sense amplifier enable signal SAE shifts from the low level to the high level.

Thus, the sense amplifier SA is activated, and amplifies the potential difference between the potential Vq and the potential Vqb. Then, at time t3 when the amplification period Tsae by the sense amplifier SA is ended, the sense amplifier enable signal SAE shifts from the high level to the low level. Moreover, at time t3, the word line WL1 is deactivated, and the inverted precharge signal/PC shifts from the high level to the low level. Note that, in FIG. 6A, the word line WL2 for the OTP cell OTPC is in a deactivated state, and the enable signal EN1 of the offset current source OCS1 is also at a disable level, and herein, the low level.

FIG. 6B shows a similar waveform diagram to that in the case of FIG. 6A. Differences of FIG. 6B from FIG. 6A are that the word line WL2 for the OTP cell OTPC is activated in place of the word line WL1 for the memory cell MC, and that the enable signal EN1 of the offset current source OCS1 is at an enable level, and herein, the high level. That is, the control circuit 34 activates the offset current source OCS1 by using the enable signal EN1 from time t0 of activating the word line WL2 to point of time t3 of deactivating the sense amplifier SA.

Herein, the configuration example of FIG. 3 is used, so that the timing control of the control circuit 34 can be facilitated as shown in FIGS. 6A and 6B. That is, the above-mentioned second effect is obtained. Specifically, for example, at the time of the readout operation for the memory cell MC shown in FIG. 6A, and at the time of the readout operation for the OTP cell OTPC shown in FIG. 6B, the sense amplifier SA can be activated at the same time t2.

Major Effect of First Embodiment

As above, in the method of the first embodiment, the offset current source OCS1 for performing the subtraction from the cell current Icel of the OTP cell OTPC is provided, so that, representatively, it becomes possible to suppress the increase of the area in the clamp element 46, the area determining the readout potential. Moreover, in the memory array 30, the normal memory cell MC and the OTP cell OTPC are caused to be present in a mixed manner, and the sense amplifier SA in which the reference current Iref and the activation timing are made common is used, so that the readout operations for both of the cells can be performed. As a result, the nonvolatile memory 17, which is increased in efficiency from a viewpoint of the circuit area and the like, can be achieved.

Second Embodiment

Assumption Problem

FIG. 7A is a diagram for explaining an example of an assumed problem in a semiconductor device according to a second embodiment. As mentioned in the first embodiment, for example, the selection transistor STo in the OTP cell OTPC shown in FIG. 4 can be configured by connecting in parallel a plurality of the same elements as the selection transistor STc in the memory cell MC in order to flow a write current sufficient for the write to the BD state. When the readout operation is performed by using such a selection transistor STo, the distribution of the readout current can be such a distribution, for example, as shown in FIG. 7A.

First, FIG. 7A shows a current distribution at the time when the readout operation for the OTP cell OTPC is performed by using the method of the comparative example, which is shown in FIG. 11, and shows a similar current distribution to that in the case of FIG. 12. However, when the selection transistor STo with the above-mentioned parallel configuration is used, the resistance value of the OTP cell OTPC at the time of the readout operation becomes small, and accordingly, the current distribution shifts to a larger value as compared with the case in FIG. 12. That is, the distribution 52 in the P state shifts to a distribution 52a, and the distribution 53 in the BD state shifts to a distribution 53a.

As a result, in the case of performing the readout operation for the OTP cell OTPC by using the method of the first embodiment, which is shown in FIG. 3, then as shown in FIG. 7A, it is necessary to increase the offset current Iof1 by the amount of the distribution shift. As a specific example, a case is assumed where the value of the offset current is determined so that a maximum current value of the distribution 51 in the AP state in the comparative example and a maximum current value of the distribution 52 in the P state in the first embodiment are caused to coincide with each other.

In this case, for example, the offset current source OCS1 needs to add a correction current ΔI1, which corresponds to a shift amount from the distribution 52 to the distribution 52a, to the offset current Iof1 determined on the premise that the selection transistor STo is composed of one element. Moreover, in consideration of the shift from the distribution 53 to the distribution 53a, the offset current source OCS1 needs to add a correction current ΔI2, which is larger than the correction current Δ, and corresponds to the shift amount from the distribution 53 to the distribution 53a, to the offset current Iof1.

Thus, the offset current source OCS1 needs to be configured to be capable of flowing an offset current larger than the original offset current Iof1 by the correction current ΔI1 to ΔI2. As a result, in the offset current source OCS1, it is apprehended that the increase of the area and the increase of the power consumption may occur. Accordingly, as will be described below, it becomes beneficial to use a configuration example shown in FIGS. 8A and 8B.

Details of Selection Transistor and Driver Circuit

Figure 8A:
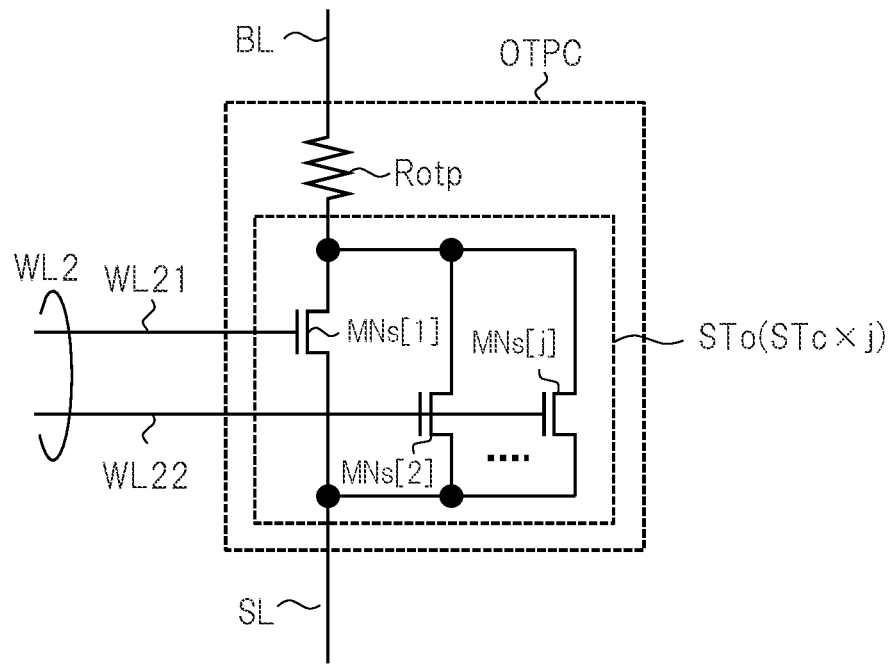
FIG. 8A is a circuit diagram showing a detailed configuration example of the OTP cell shown in FIGS. 3 and 4 in the semiconductor device according to the second embodiment

FIG. 8A is a circuit diagram showing a detailed configuration example of the OTP cell shown in FIGS. 3 and 4 in the semiconductor device according to the second embodiment The selection transistor STo in the OTP cell OTPC shown in FIG. 8A is composed of j pieces of transistor elements connected in parallel, specifically, j pieces of nMOS transistors MNs[1] to MNs[j]. Herein, j is an integer larger than 1. Moreover, though not shown, the selection transistor STc in the memory cell MC is composed of i pieces among the j pieces of transistor elements, for example, one transistor element while defining that i is an integer smaller than j.

Herein, the word line WL2 for the OTP cell OTPC is composed of two divided word lines WL21 and WL22 which are individually activated. The i pieces of, for example, one nMOS transistor MNs[1] is controlled to be ON/OFF by the divided word line WL21, and the remaining j−i pieces of, for example, j−1 pieces of nMOS transistors MNs[2] to MNs[j] are controlled to be ON/OFF by the divided word line WL22.

Figure 8B:
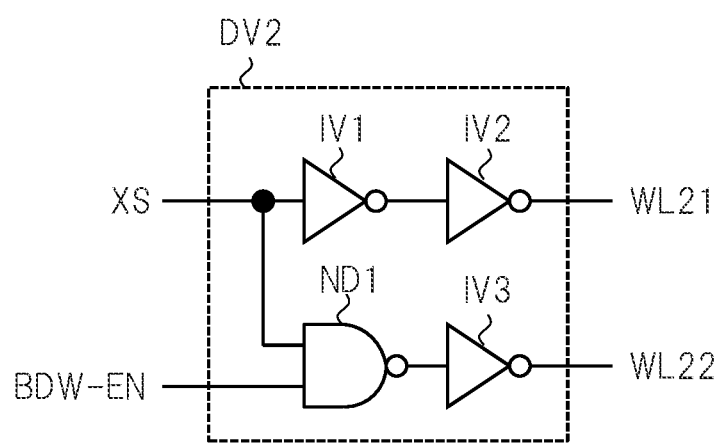
FIG. 8B is a circuit diagram showing a detailed configuration example of a driver circuit when the OTP cell shown in FIG. 8A is used.

FIG. 8B is a circuit diagram showing a detailed configuration example of a driver circuit when the OTP cell shown in FIG. 8A is used. FIG. 8B shows details of the driver circuit DV2 for the OTP cell OTPC in FIG. 3. The driver circuit DV2 shown in FIG. 8B includes inverter circuits IV1 to IV3 and a NAND operation circuit ND1.

Two inverter circuits IV1 and IV2 are connected in a cascade manner, and dive the divided word line WL21 in accordance with the word line selection signal XS output from the control circuit 34 shown in FIG. 2A. The NAND operation circuit ND1 performs a NAND operation of the word line selection signal XS and a write enable signal BDW-EN to the BD state. The inverter circuit IV3 drives the divided word line WL22 in accordance with an operation result of the NAND operation circuit ND1. Note that the write enable signal BDW-EN is generated by the control circuit 34. Moreover, the inverter circuit IV3 may have twice a drive capability of the inverter circuit IV2.

FIG. 9 is a diagram for explaining an operation example when the configuration examples shown in FIGS. 8A and 8B are used. FIG. 9 shows the number of elements of the selection transistor, which turn ON at the time of the readout operation and at the time of the write operation. In FIG. 9, at the time of the readout operation and the write operation for the memory cell MC, the number of elements of the selection transistor STc, which turn ON, is i pieces where i is an integer of 1 or more and an integer smaller than j.

Moreover, also at the readout operation for the OTP cell OTPC, the number of elements of the selection transistor STo, which turn ON, is i. That is, in FIG. 8B, since the write enable signal BDW-EN is at the low level, only the 1 divided word line WL21 between the two divided word lines WL21 and WL 22 is activated. Meanwhile, at the write operation for the OTP cell OTPC, the number of elements of the selection transistor STo, which turn ON, is j, which is an integer larger than i. That is, in FIG. 8B, since the write enable signal BDW-EN is at the high level, both of the two divided word lines WL21 and WL 22 are activated.

Note that, in FIG. 8A, as an example, the case is illustrated where the selection transistor STc in the memory cell MC is composed of one transistor element, and the selection transistor STo in the OTP cell OTPC is composed of j pieces of (j>1) transistor elements. However, in terms of layout design, the selection transistor STc can also be composed of i pieces of transistor elements by dividing one transistor element into a plurality of pieces. Herein, i is an integer of 1 or more. In this case, it is sufficient if the selection transistor STo is composed of j pieces of transistor elements, where j is an integer larger than i.

Herein, it is sufficient if the word line WL2 for the OTP cell OTPC is composed of a plurality of divided word lines which are individually activated. In this case, any one of the j pieces of transistor elements is controlled to be ON/OFF by any one of the plurality of word lines, and any other one of the j pieces of transistor elements is controlled to be ON/OFF b any other one of the plurality of divided word lines. Then, in FIG. 9, it is sufficient if the number of the transistor elements controlled to be ONA at the time of the write operation for the OTP cell OTPC to the BD state is larger than the number of the transistor elements controlled to be ON at the time of the readout operation for the OTP cell OTPC.

Major Effect of Second Embodiment

As above, the method of the second embodiment is used on the premise of the first embodiment, so that the problem in the first embodiment can be somewhat reduced while maintaining the variety of effects mentioned in the first embodiment. That is, a configuration is adopted so that the number of the transistor elements controlled to be ON can be changed in the selection transistor STo in the OTP cell OTPC composed of the plurality of transistor elements, so that it becomes unnecessary to correct the offset current. Specifically, the number of the elements of the selection transistor, which are controlled to be ON can be the same between at the readout operation for the OTP cell OTPC and the readout operation for the memory cell MC, and accordingly, such a distribution shift as shown in FIG. 7A does not occur. Therefore, it becomes unnecessary t add the correction currents ΔI1 and ΔI2. As a result, in the offset current source OCS1, it becomes necessary to reduce the area and the power consumption.

Third Embodiment

In the second embodiment, the description has been given of the example in which the method of the second embodiment, which is shown in FIGS. 8A and 8B and the like, is applied to the method of the first embodiment, which is shown in FIG. 3; however, it is also possible to apply the method of the second embodiment to the method of the comparative example, which is shown in FIG. 11. Thus, similar effects to those of the variety of similar effects mentioned in the first embodiment are obtained slightly.

FIG. 7B is a diagram showing an example of the readout current distribution of the OTP cell when the method of the second embodiment is applied to the method of the comparative example in the semiconductor device according to the third embodiment. First, in the upper part of FIG. 7B, the readout current distribution at the time of performing the readout operation for the OTP cell OTPC by using the method of the comparative example, which is shown in FIG. 11, is shown. As mentioned in the second embodiment, when the selection transistor STo with the parallel configuration is fully activated, the resistance value of the OTP cell OTPC at the time of the readout operation becomes small, and accordingly, the current distribution shifts to a larger value as compared with the case in FIG. 12.

That is, the distribution 52 in the P state shown in FIG. 12 shifts upward by ΔI1 as shown in the distribution 52a in FIG. 7B, and the distribution 53 in the BD state shown in FIG. 12 shifts upward by ΔI2 as shown in the distribution 53a in FIG.

7B. Hence, at the time of the readout operation for the OTP cell OTPC, the reference current source 55 in the comparative example shown in FIG. 11 has needed to not only increase the reference current Iref by +α, but also increase the same by the correction current ΔI1.

Meanwhile, when the method of the second embodiment is applied to the method of the comparative example, then as shown in the lower portion of FIG. 7B, similar effects to the variety of effects mentioned in the first embodiment are obtained slightly. That is, the OTP cell OTPC shown in FIG. 11 is configured so that the selection transistor STo is composed of a plurality of transistor elements, and further, so that the number of the transistor elements controlled to be ON can be changed.

Thus, the distribution 52a in the P state shifts downward by ΔI1 as shown in the distribution 52 in FIG. 7B, and the distribution 53a in the BD state shifts downward by ΔI2 as shown in the distribution 53 in FIG. 7B. As a result, it becomes possible to slightly suppress the increase of the area in the clamp element 46 that determines the readout potential. Moreover, in the offset adjustment of the reference current Iref in the reference current source 55, that is, in the adjustment of "+α+ΔI1", the amount of the correction current ΔI1 becomes unnecessary. Thus, it becomes possible to slightly suppress the increase of the power consumption in the sense amplifier SA at the time of the readout operation for the OTP cell OTPC.

Fourth Embodiment

In the above-mentioned first to third embodiments, the description has been given of the readout operation in the case of determining whether or not there is a dielectric breakdown of the storage element Rotp in the OTP cell OTPC shown in FIG. 8A. In the specification, a mode of this readout operation is referred to as an OTP mode. Meanwhile, it is also possible to write the P state or the AP state to the storage element Rotp in the OTP cell OTPC, and to perform the readout operation by using the OTP cell OTPC as a normal memory cell MC. In the specification, a mode of this readout operation is referred to as a normal MC mode.

The semiconductor device according to the fourth embodiment is settable to the OTP mode of using the OTP cell OTPC as an OTP cell, or to the normal MC mode of using the OTP cell OTPC as a normal memory cell MC. Specifically, for example, the control circuit 34 shown in FIG. 2A is subject to previous setting as to which OTP cell OTPC among the plurality of OTP cells OTPC is to be operated in the normal MC mode. The control circuit 34 controls the respective units in accordance with this setting, so that the semiconductor device changes operation contents for the OTP cell OTPC as will be mentioned below.

Figures 14A, 14B:
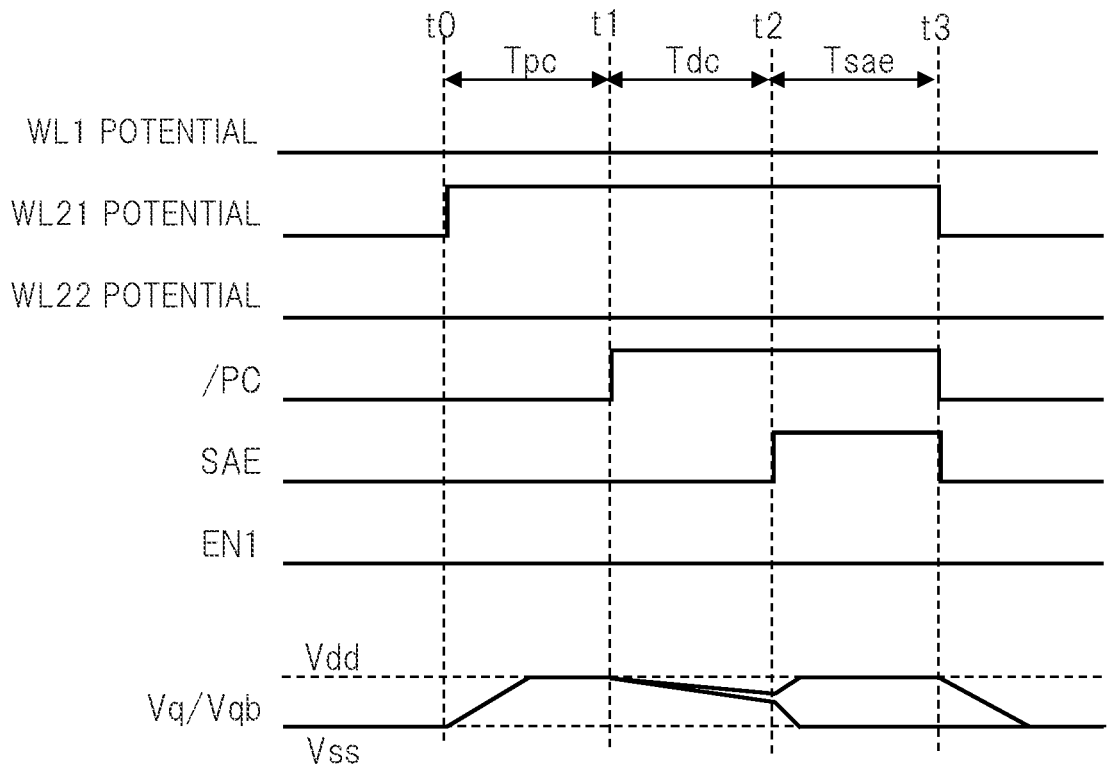
FIG. 14A is a waveform diagram showing an operation example when an OTP cell OTPC is operated in a normal MC mode in a semiconductor device according to a fourth embodiment.
FIG. 14B is a table showing the number of elements of a selection transistor, which turn ON at the time of each operation mode in the OTP cell, in the semiconductor device according to the fourth embodiment.

FIG. 14A is a waveform diagram showing an operation example when the OTP cell OTPC is operated in the normal MC mode in the semiconductor device according to the fourth embodiment. In FIG. 14A, unlike the case of FIG. 6B, the enable signal EN1 is not activated during the period while the divided word line WL21 is activated. As a result, a similar operation to that in the case of the readout operation for the memory cell MC, which is shown in FIG. 6A, is carried out in the OTP cell OTPC.

FIG. 14B is a table showing the number of elements of the selection transistor, which turn ON at the time of each operation mode in the OTP cell, in the semiconductor device according to the fourth embodiment. In the case of writing the P state or the AP state to the storage element Rotp in the OTP cell OTPC, that is, in the case of performing the write operation in the normal MC mode, the number of the elements of the selection transistor STo, which turn ON, is i pieces in order to prevent a dielectric breakdown due to overcurrent application. Herein, i is the same value as the number of elements which constitute the selection transistor STc in the normal memory cell MC, and is an integer of 1 or more.

Moreover, also in the case of reading the OTP cell OTPC in the normal MC mode, the number of elements of the selection transistor STo, which turn ON, is i pieces. As described above, when the semiconductor device is set to the normal MC mode, the number of the transistor elements in the OTP cell OTPC, which are controlled to be ON at the time of the write operation and the readout operation for the OTP cell OTPC is the same as the number of the transistor elements in the memory cell MC, which are controlled to be ON at the time of the write operation and the readout operation for the normal memory cell MC.

Major Effect of Fourth Embodiment

As shown in FIGS. 14A and 14B, the OTP cell OTPC is operated in the normal MC mode, so that two added values are obtained. As a first added value, in an application in which all the OTP cells OTPC prepared in the memory array 30 do not need to be used for OPT, such unnecessary OTP cells OTPC can be assigned to the normal memory cell MC. As a result, the normal memory cell region can be increased slightly. As a second added value, for the OTP cell OTPC for which the write to the BD state is not carried out yet, the readout operation and the write operation can be performed in a similar way to the normal memory cell MC. As a result, this OTP cell OTPC can be used as a save memory that temporarily stores data written to the OTP cell OTPC, for example, security data.

Fifth Embodiment

Assumption Problem

Figure 13:
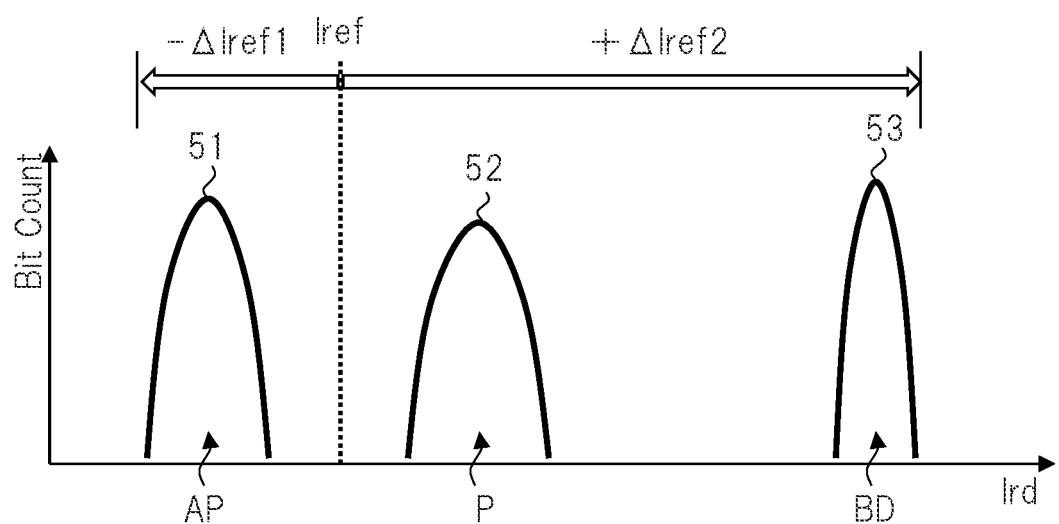
FIG. 13 is a diagram for explaining an operation example of the readout circuit shown in FIG. 11, the operation example being different from the operation example in FIG. 12.

FIG. 13 is a diagram for explaining an operation example of the readout circuit shown in FIG. 11, the operation example being different from the operation example in FIG. 12. FIG. 13 shows distributions 51, 52 and 53 of a readout current Ird in the case of using the configuration example of FIG. 11 in a similar way to the case of FIG. 12. For example, at the time of testing the nonvolatile memory 17 by a test device, the distributions of the readout current Ird, and eventually, of the cell current Icel and the resistance value are sometimes desired to be measured.

In this case, for example, such a method is conceivable, in which, by using the configuration example shown in FIG. 11, and as shown in FIG. 13, the current value of the reference current source 55 is variably set within a range from "Iref-ΔIref1" to "Iref+ΔIref2" by the current value setting signal Iset. However, when the current value of the reference current source 55 is variably set as described above, then particularly, as mentioned in the second problem in FIG. 11, an appropriate discharge period differs for each current value of the reference current source 55, and accordingly, it is apprehended that the timing control may be complicated. Accordingly, it becomes beneficial to use the configuration example shown in FIG. 10.

Details of Readout Circuit

Figure 10:
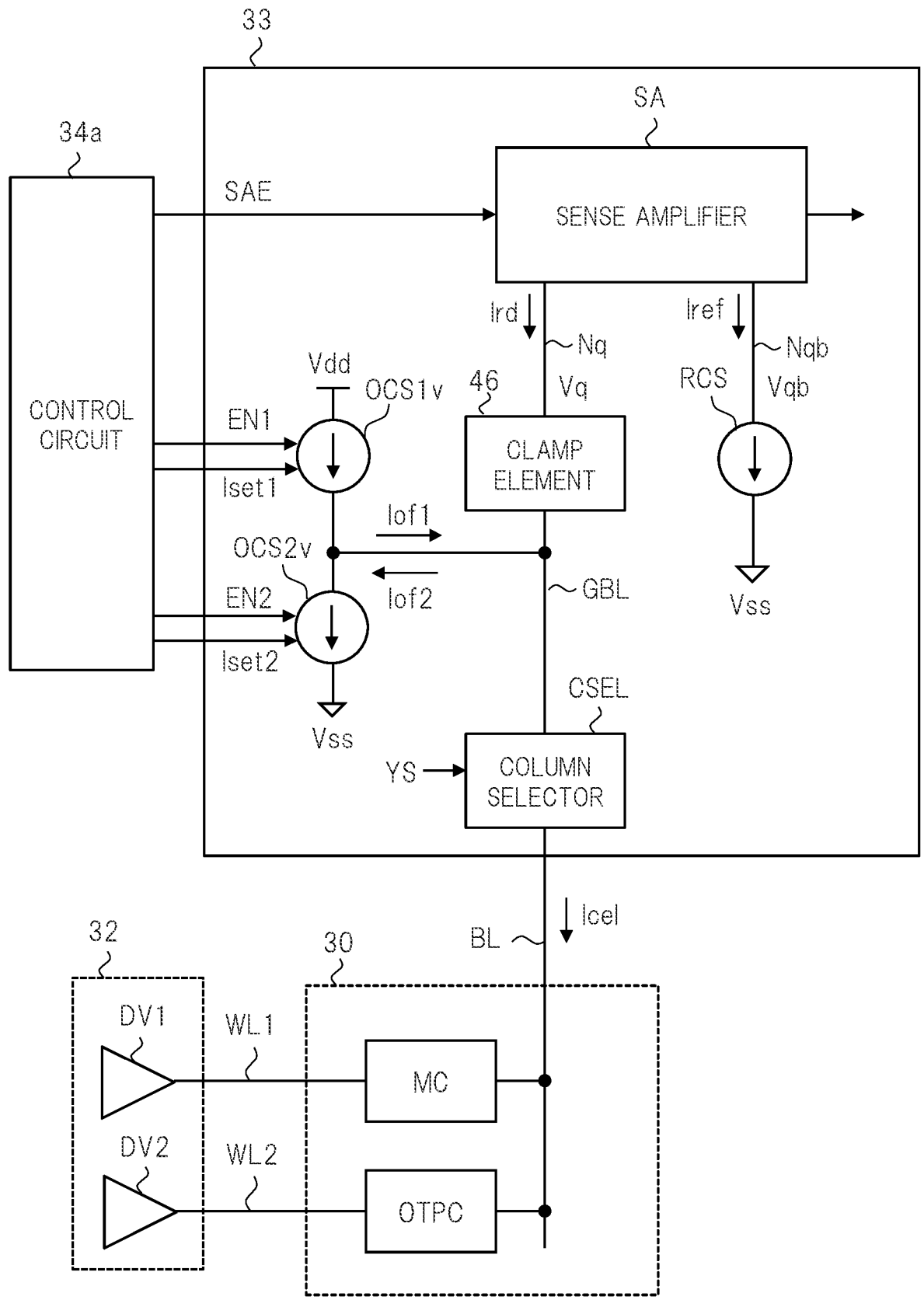
FIG. 10 is a schematic diagram showing a configuration example of a main portion of the readout circuit in FIG. 2A in a semiconductor device according to a fifth embodiment.

FIG. 10 is a schematic diagram showing a configuration example of a main portion of the readout circuit in FIG. 2A in a semiconductor device according to a fifth embodiment. The configuration example shown in FIG. 10 is different from the configuration example shown in FIG. 3 in terms of the following two points. A first difference is that two offset current sources OCS1v and OCS2v are provided. A second difference is that a control circuit 34a different from that in the case of FIG. 3 is provided as the two offset current sources OCS1v and OCS2v are provided.

As in the case of FIG. 3, the offset current source OCS1v is connected between the high potential-sided power supply potential Vdd and the bit line BL. However, unlike the case of FIG. 3, the offset current source OCS1v is a variable current source. At the time of the readout operation for testing for the OTP cell OTPC, the offset current source OCS1v is activated by the enable signal EN1, and at the time of being activated, generates the offset current Iof1 to be subtracted from the cell current Icel. Moreover, the offset current source OCS1v determines the value of this offset current Iof1 on the basis of a current value setting signal Iset1.

Further, the offset current source OCS1v is used at the time of measuring the distribution of the readout current Ird not only in the OTP cell OTPC but also in the normal memory cell MC. That is, also at the time of the readout operation for testing for the normal memory cell MC, the offset current source OCS1v is activated by the enable signal EN1, and at the time of being activated, generates the offset current Iof1 to be subtracted from the cell current Icel. Moreover, the offset current source OCS1v determines the value of this offset current Iof1 on the basis of the current value setting signal Iset1.

Meanwhile, the offset current source OCS2v is connected between the ground potential Vss, which is the low potential-sided power supply potential, and the bit line BL, and is a variable current source. At the time of the readout operation for the testing for the OTP cell OTPC or the normal memory cell MC, the offset current source OCS2v is activated by an enable signal EN2, and at the time of being activated, generates an offset current Iof2 to be added to the cell current Icel. Moreover, the offset current source OCS2v determines the value of this offset current Iof2 on the basis of a current value setting signal Iset2.

At the time of the readout operation for the testing for the OTP cell OTPC or the normal memory cell MC, the control circuit 34a activates either one of the two offset current sources OCS1v and OCS2v by the enable signals EN1 and EN2. Moreover, the control circuit 34a variably controls the value of the offset current Iof1 or the value of the offset current Iof2 by the current value setting signals Iset1 and Iset2.

With such a configuration, at the time of the readout operation for the testing for the OTP cell OTPC or the normal memory cell MC, the sense amplifier SA detects a magnitude relationship between the reference current Iref and the readout current Ird obtained by subtracting the offset current Iof1 from the cell current Icel. Alternatively, the sense amplifier SA detects a magnitude relationship between the reference current Iref and the readout current Ird obtained by adding the offset current Iof2 to the cell current Icel.

As described above, when the configuration example of FIG. is used, it becomes possible to measure the distributions of the readout current Ird, and eventually, of the cell current Icel and the resistance value without changing the value of the reference current Iref. As a result, such a problem as mentioned in FIG. 13 does not occur, and it becomes possible to facilitate the timing control, and eventually, to facilitate the test. Specifically, at the time of the readout operation for the testing for the OTP cell OTPC or the normal memory cell MC, the control circuit 34a just needs to activate the sense amplifier SA at the same point of time regardless of the value of the offset current Iof1 and the value of the offset current Iof2.

Note that, specifically, for example, as in the case of the offset current source OCS1 shown in FIG. 4, the offset current source OCS2v can include a current mirror circuit composed of two nMOS transistors. Moreover, for example, the variable current source can be achieved by a method, in which the pMOS transistor MPm1 in FIG. 4 is composed of a plurality of elements different in transistor size in the unit of $2^n$, and the plurality of elements connected in parallel are selectively activated, or the like. That is, the variable current source can be achieved by adopting a configuration so that a current mirror ratio can be sequentially adjusted.

Further, in the configuration example of FIG. 10, the offset current source OCS2v is connected between the ground potential Vss and the bit line BL. However, for example, such a readout potential of 0.1 V is applied to the bit line BL, and accordingly, a source/drain voltage of the nMOS transistor that constitutes the offset current source OCS2v may not be able to be sufficiently ensured in some cases. In this case, the offset current source OCS2v may be connected between the ground potential Vss and the node Nq.

Major Effect of Fifth Embodiment

As above, the method of the fifth embodiment is also used, so that similar effects to the variety of effects mentioned in the first, second and fourth embodiments are obtained. Moreover, the two variable-type offset current sources OCS1v and OCS2v are provided, so that it becomes possible to achieve the facilitation of the test, and the like.

While the invention made by the inventor thereof has been specifically described on the basis of the embodiments thereof, needless to say, the present invention is not limited to the above-described embodiments, and is modifiable in various ways within the scope without departing from the spirit thereof.

What is claimed is:

1. A semiconductor device comprising:
   a bit line;
   a first memory cell that is connected to the bit line and includes a first storage element of a variable resistance type;
   a second memory cell that is connected to the bit line, includes a second storage element having same electrical characteristics as the first storage element, and is used as a One Time Programmable (OTP) cell;
   a clamp element configured to apply a fixed potential to the bit line at a time of a readout operation;
   a reference current source configured to generate a reference current;
   a sense amplifier configured to apply the fixed potential to the first memory cell or the second memory cell at the time of the readout operation to detect, by using the reference current, a magnitude of a cell current flowing through the bit line; and
   an offset current source that is activated at a time of the readout operation for the second memory cell, and is configured to generate, at a time of being activated, an offset current to be subtracted from the cell current,
   wherein, at the time of the readout operation for the second memory cell, the sense amplifier detects a magnitude relationship between the reference current and a readout current obtained by subtracting the offset current from the cell current.

2. The semiconductor device according to claim 1, further comprising a first word line and a second word line, wherein the first memory cell includes a first selection transistor configured to form a current path of the first storage element and the bit line at a time when the first word line is activated, and wherein the second memory cell includes a second selection transistor configured to form a current path of the second storage element and the bit line at a time when the second word line is activated.

3. The semiconductor device according to claim 2, wherein the first selection transistor is composed of i pieces of transistor elements, where i is an integer of 1 or more, wherein the second selection transistor is composed of j pieces of transistor elements, where j is an integer larger than i, wherein the second word line is composed of a plurality of divided word lines which are individually activated, wherein i pieces among the j pieces of transistor elements are controlled to be ON/OFF by any one of the plurality of divided word lines, and wherein j−i pieces among the j pieces of transistor elements are controlled to be ON/OFF by any other one of the plurality of divided word lines.

4. The semiconductor device according to claim 3, wherein a number of transistor elements in the second memory cell, the transistor elements being controlled to be ON at a time of a write operation for the second memory cell, is larger than a number of transistor elements in the second memory cell, the transistor elements being controlled to be ON at the time of the readout operation for the second memory cell.

5. The semiconductor device according to claim 3, wherein the semiconductor device is settable to an OTP mode of using the second memory cell as an OTP cell, or to a normal MC mode of using the second memory cell as a normal MC mode, and wherein, when the semiconductor device is set to the normal MC mode, a number of transistor elements in the second memory cell, the transistor elements being controlled to be ON at a time of a write operation and a readout operation for the second memory cell, is same as a number of transistor elements in the first memory cell, the transistor elements being controlled to be ON at a time of a write operation and a readout operation for the first memory cell.

6. The semiconductor device according to claim 1, further comprising a control circuit configured to activate the sense amplifier at a same point of time at a time of the readout operation for the first memory cell and at a time of the readout operation for the second memory cell.

7. The semiconductor device according to claim 2, further comprising a control circuit configured to activate the offset current source during a period from a point of time of activating the second word line until a point of time of deactivating the sense amplifier.

8. The semiconductor device according to claim 1, wherein the offset current source is connected between a high potential-sided power supply potential and the bit line.

* * * * *